United States Patent
Sumi et al.

(10) Patent No.: US 12,317,422 B2
(45) Date of Patent: May 27, 2025

(54) COMPONENT MOUNTING SYSTEM

(71) Applicant: Panasonic Intellectual Property Management Co., Ltd., Osaka (JP)

(72) Inventors: Hideki Sumi, Fukuoka (JP); Ryouji Eguchi, Fukuoka (JP); Hiroki Yamamoto, Fukuoka (JP)

(73) Assignee: PANASONIC IP MANAGEMENT CO., LTD., Osaka (JP)

( * ) Notice: Subject to any disclaimer, the term of this patent is extended or adjusted under 35 U.S.C. 154(b) by 976 days.

(21) Appl. No.: 17/298,671

(22) PCT Filed: Dec. 10, 2018

(86) PCT No.: PCT/JP2018/045199
§ 371 (c)(1),
(2) Date: Jun. 1, 2021

(87) PCT Pub. No.: WO2020/121361
PCT Pub. Date: Jun. 18, 2020

(65) Prior Publication Data
US 2022/0022351 A1    Jan. 20, 2022

(51) Int. Cl.
*H05K 13/08* (2006.01)
*H05K 13/04* (2006.01)
*H05K 13/00* (2006.01)

(52) U.S. Cl.
CPC ....... *H05K 13/0882* (2018.08); *H05K 13/082* (2018.08); *H05K 13/083* (2018.08);
(Continued)

(58) Field of Classification Search
CPC ............. H05K 13/0882; H05K 13/082; H05K 13/083; H05K 13/0411; H05K 13/046; H05K 13/0452; H05K 13/0015
See application file for complete search history.

(56) References Cited

U.S. PATENT DOCUMENTS

2008/0014772 A1* 1/2008 Ogura .................. H05K 13/083
439/83
2012/0317804 A1* 12/2012 Endo .................. H05K 13/0452
29/703
(Continued)

FOREIGN PATENT DOCUMENTS

JP    2010251398 A  * 11/2010
WO    2014/203331      12/2014

OTHER PUBLICATIONS

Leta et al, "Computational system to detect defects in mounted and bare PCB Based on connectivity and image correlation," 2008 15th International Conference on Systems, Signals and Image Processing, Bratislava, Slovakia, 2008, pp. 331-334. (Year: 2008).*
(Continued)

*Primary Examiner* — A. Dexter Tugbang
(74) *Attorney, Agent, or Firm* — McDonald Hopkins LLC

(57) ABSTRACT

A component mounting system includes a plurality of component mounters, a characteristic inspection device, and a management device. Each of the component mounters transmits inspection area component information including identification information of the corresponding component mounter, information of a conveyed-in board, and identification information of an inspection-required component installed in an inspection area, to the management device. The characteristic inspection device determines whether or not the inspection-required component installed in the inspection area is an error component, and transmits the information on the determined inspection-required component to the management device as error information. The management device specifies the component mounter in which the inspection-required component determined to be an error component is installed in the inspection area as an error component mounter, based on the transmitted error (Continued)

information, and stops an operation of the identified component mounter.

6 Claims, 16 Drawing Sheets

(52) U.S. Cl.
CPC ...... *H05K 13/0015* (2013.01); *H05K 13/0411* (2018.08); *H05K 13/0452* (2013.01); *H05K 13/046* (2013.01)

(56) References Cited

U.S. PATENT DOCUMENTS

2015/0289426 A1* 10/2015 Mantani ............ H05K 13/0015
228/9
2016/0150687 A1   5/2016 Shibata

OTHER PUBLICATIONS

International Search Report of PCT application No. PCT/JP2018/045199 dated Feb. 19, 2019.

* cited by examiner

FIG. 6

| SEQUENCE NUMBER | NOZZLE IDENTIFICATION INFORMATION | X | Y | θ | COMPONENT IDENTIFICATION INFORMATION | COMPONENT SUPPLY POSITION |
|---|---|---|---|---|---|---|
| 1 | | | | | | |
| 2 | | | | | | |
| 3 | | | | | | |
| 4 | | | | | | |
| 5 | | | | | | |
| 6 | | | | | | |

INSTALLATION SEQUENCE PROGRAM (41, 41A)

FIG. 7

COMPONENT DATA (42, 42A)

| COMPONENT IDENTIFICATION INFORMATION | DIMENSION DATA | NOZZLE IDENTIFICATION INFORMATION | ... | ELECTRICAL CHARACTERISTICS INSPECTION FLAG |
|---|---|---|---|---|
| | | | | |
| | | | | |
| | | | | |
| | | | | |
| | | | | |
| | | | | |

FIG. 10

| SEQUENCE NUMBER | NOZZLE IDENTIFICATION INFORMATION | X | Y | θ | COMPONENT IDENTIFICATION INFORMATION | COMPONENT SUPPLY POSITION |
|---|---|---|---|---|---|---|
| 1 | | | | | | |
| 2 | | | | | | |
| 3 | | | | | | |
| 4 | | | | | | |
| 5 | | | | | | |
| 6 | | | | | | |
| 7 | | | | | | |

COMPONENT MOUNTING SYSTEM

TECHNICAL FIELD

The present disclosure relates to a component mounting system for installing a component on a board.

BACKGROUND ART

A board (mounting board) incorporated in an electrical product is produced by installing a plurality of types of component on a pattern electrode provided on the board. A component mounting system that produces such a mounting board is configured with a mounting work unit and a management device that manages an operation of the mounting work unit.

The mounting work unit is generally configured such that a printing device for printing a solder on a board, a plurality of component mounters for installing a component on a board, a reflow device for reflowing a solder, and an appearance inspection device for inspecting appearance of the board are arranged in this order from the upstream side of the flow of the board.

The component mounter that configures the mounting work unit of the component mounting system is configured to install the component supplied by a component feeder to the conveyed-in board. Here, an installation head operates based on an installation sequence program, and repeatedly executes the installation turn for installing the component picked up from the component feeder on the board.

In the component mounter, in a case where the component supplied by the component feeder is in an insufficient state while the above-described installation turn is repeatedly performed, the component is additionally replenished by the work of an operator. By the setup change or the like, in a case where the need to change the type of component to be supplied occurs, the component feeder is removed by the operator, the component to be supplied is changed, and then, the component feeder is installed again.

Meanwhile, since the work of additional replenishment of components or change of the type of component requires manual work by the operator, it is not possible to completely prevent occurrence of human errors such as a component setting error. Due to the setting error of the component to the component feeder, when the component feeder supplies a component different from the component that is supposed to be originally supplied, all the boards on which the components are installed becomes defective boards, and thus, there is a concern that a great deal of loss occurs.

Therefore, conventionally, in a case where the additional replenishment of the component or the change of the type of component are performed, by inspecting electrical characteristics such as resistance, electrostatic capacity, or resistance of the component by a characteristic checker installed in each of the component mounters, it is confirmed whether or not a setting error occurs in a component newly set in the component feeder. Accordingly, it is possible to prevent production of a defective board caused by the setting error of the component and to suppress the occurrence of loss as much as possible (for example, refer to Patent Literature 1 as follows).

CITATION LIST

Patent Literature

PTL 1: International Publication No. 2014/203331

SUMMARY OF THE INVENTION

According to the present disclosure, there is provided a component mounting system including: a plurality of component mounters that convey, sequentially from upstream, a board having a product area in which a pattern electrode incorporated in an electrical product is disposed and an inspection area in which an inspection electrode for inspection of electrical characteristics is disposed, each of the component mounters installing a component supplied by a component feeder in the product area, installing an inspection-required component that requires the inspection of the electrical characteristics among the component supplied by the component feeder in the inspection area and conveying out the board; a characteristic inspection device that inspects the electrical characteristics of the inspection-required component installed in the inspection area by any of the plurality of component mounters; and a management device that manages the plurality of component mounters and the characteristic inspection device, in which each of the plurality of component mounters includes an transmitter for transmitting inspection area component information to the management device, the inspection area component information including identification information of the component mounter, identification information of the board, and identification information of the inspection-required component installed in the inspection area to record an installed state of the inspection-required component in the inspection area, the characteristic inspection device includes an error determiner for determining whether or not the inspection-required component installed in the inspection area is an error component, and an error information transmitter for transmitting error information to the management device, the error information being information on the inspection-required component determined to be the error component by the error determiner, and the management device includes an error occurrence location identifier for identifying an error component mounter based on the error information transmitted by the error information transmitter, the error component mounter being included in the plurality of component mounters and installing the inspection-required component is installed in the inspection area, and a stop command transmitter for stopping an operation of the error component mounter identified by the error occurrence location identifier.

According to the present disclosure, it is possible to suppress the occurrence of loss as much as possible in a case where the component feeder of the component mounter supplies a component that is not supposed to be originally supplied.

BRIEF DESCRIPTION OF DRAWINGS

FIG. 6 is a view illustrating an image of an installation sequence program stored in a mounter storage unit according to the exemplary embodiment.

FIG. 7 is a view illustrating an image of component data stored in the mounter storage unit according to the exemplary embodiment.

FIG. 10 is a view illustrating an image of the installation sequence program stored in the mounter storage unit according to the exemplary embodiment.

DESCRIPTION OF EMBODIMENTS

As described above, as replenishment of components or change of types of component are performed during production of a mounting board, inspection of electrical characteristics of a component that requires inspection of electrical characteristics is substantially effective in preventing the occurrence of human error by an operator, but there is a disadvantage that it costs a lot to install an expensive characteristic checker in each component mounter.

Here, it is conceivable that, among regions on a board, a region different from a product area in which the component incorporated as a part of an electrical product is installed is provided on the board as an inspection area, and in a case where it is necessary to perform inspection of electrical characteristics of the component during the production of the mounting board, the component is installed in the inspection area, and after installation work of the component is completed, the electrical characteristics of the component are inspected. By doing so, it is not necessary to assemble the characteristic checker to all the component mounters, and thus, the cost can be significantly reduced. However, in such a configuration, in a case where the component (error component) that is not supposed to be originally supplied by the component feeder is supplied, the board on which the error component is installed until then becomes a defective board. Therefore, it is necessary to devise a method for suppressing the loss in a case where the error component is supplied from the component feeder.

An object of the present disclosure is to provide a component mounting system that can suppress the occurrence of loss as much as possible in a case where the component feeder of the component mounter supplies a component that is not supposed to be originally supplied.

EXEMPLARY EMBODIMENT

Figure 1:
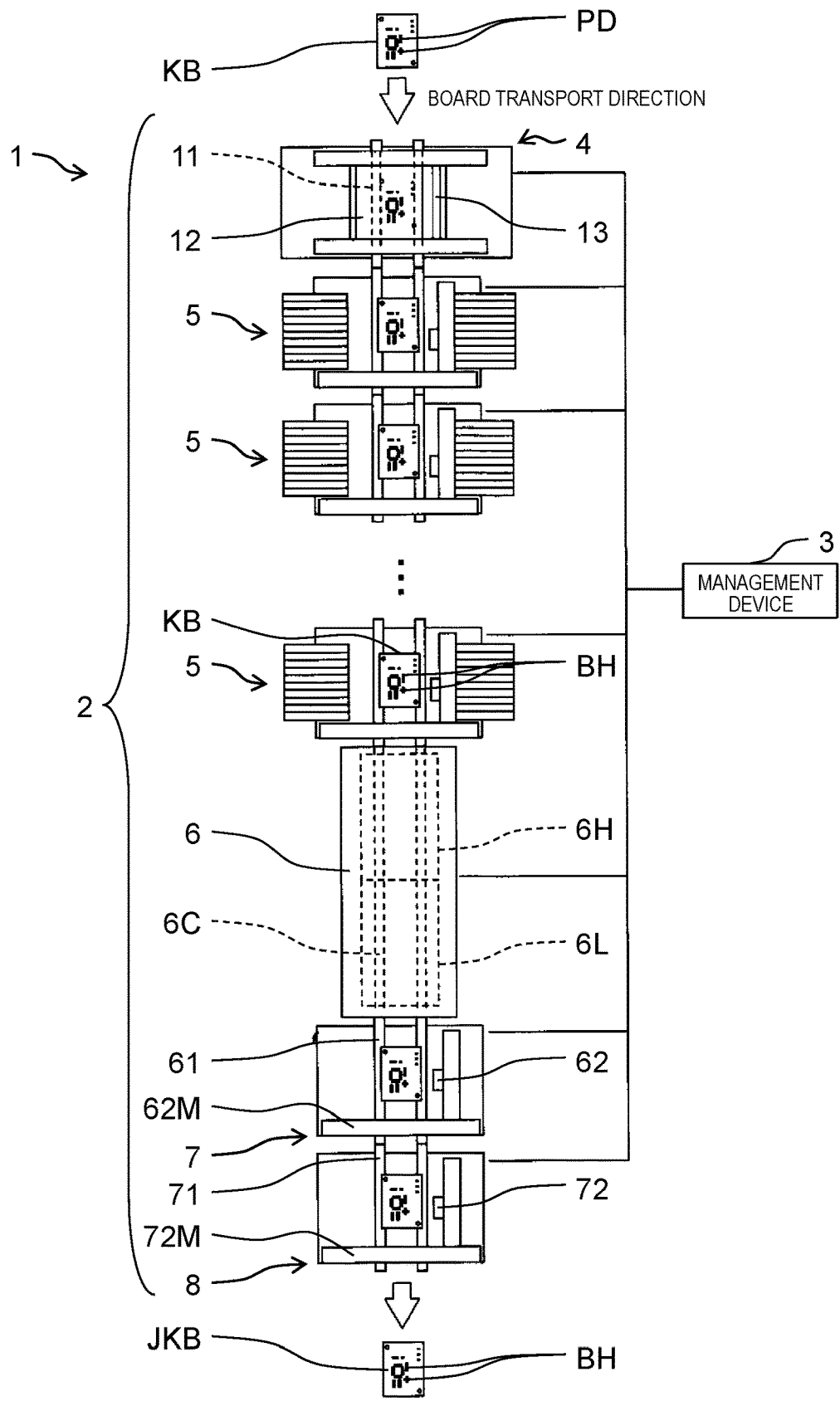
FIG. 1 is a view for describing a configuration of a component mounting system which includes a component mounter according to an exemplary embodiment.

Next, an exemplary embodiment of the present disclosure will be described. FIG. 1 is component mounting system 1 for producing mounting board JKB by installing component BH on board KB, and includes mounting work unit 2 and management device 3 for managing an operation of mounting work unit 2. In mounting work unit 2, printing device 4, a plurality of component mounters 5, reflow furnace 6, appearance inspection device 7, and characteristic inspection device 8 are configured to be arranged in this order from the upstream side (upper side in FIG. 1) of the flow of board KB. Each device (printing device 4, the plurality of component mounters 5, reflow furnace 6, appearance inspection device 7, and characteristic inspection device 8) that configures mounting work unit 2 can transmit and receive data to and from management device 3, respectively.

Management device 3 stores information such as an operation program or operation parameters necessary for the operation of each device that configures mounting work unit 2. Management device 3 collects and stores log information fed from each device during the production of mounting board JKB. Before starting the production of mounting board JKB, each device downloads the production data including the operation program or the operation parameters and stores the production data in a storage unit provided in each device. Each device operates based on the downloaded production data. Each device includes a bar code reader (not illustrated) for reading the bar code provided on the surface of conveyed-in board KB. Each device transmits the identification information (board identification ID) of board KB read by the bar code reader to management device 3. Management device 3 stores the log information fed from each device in association with the identification information of board KB.

Figure 2:
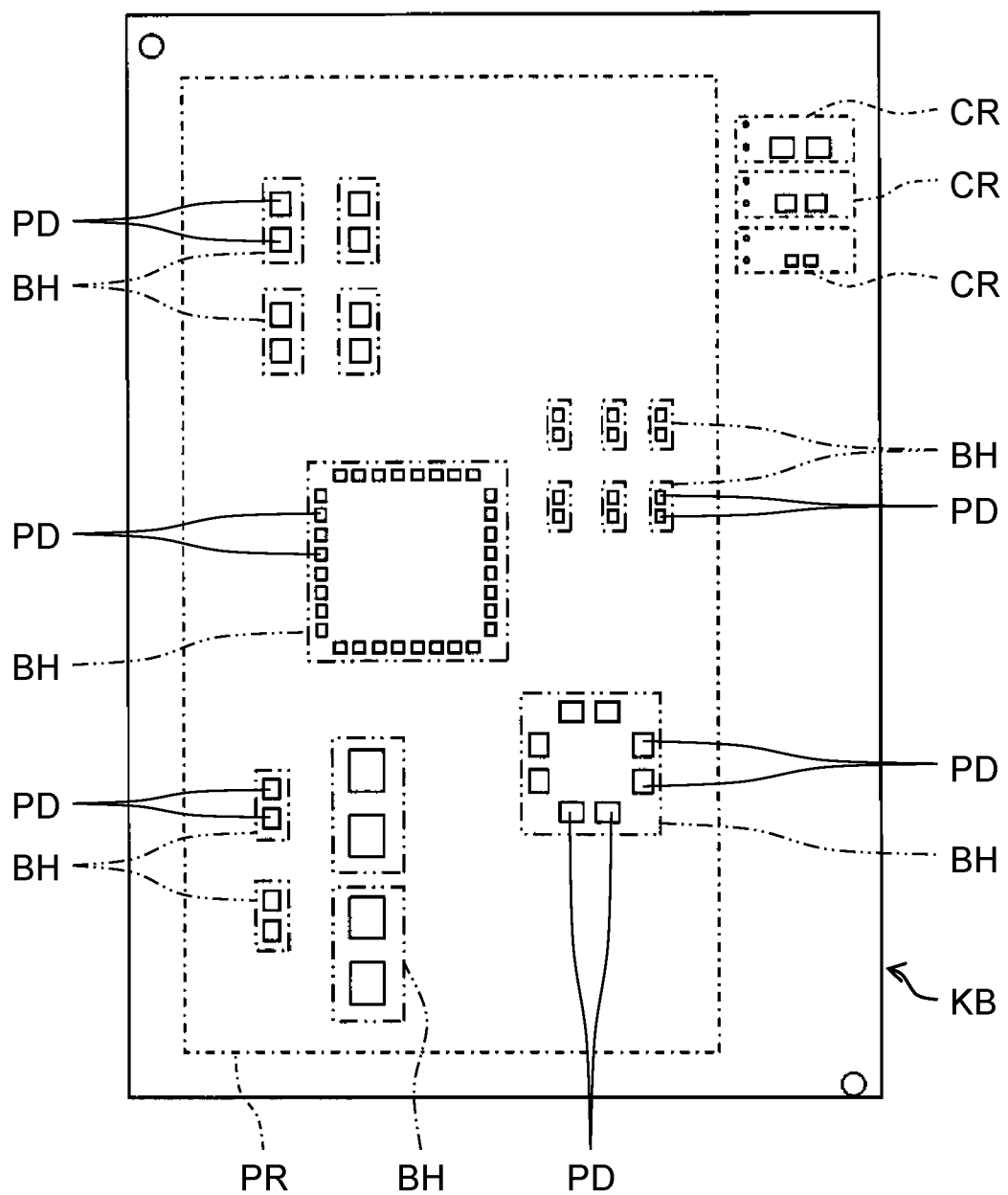
FIG. 2 is a plan view of a board according to the exemplary embodiment.
Figure 3:
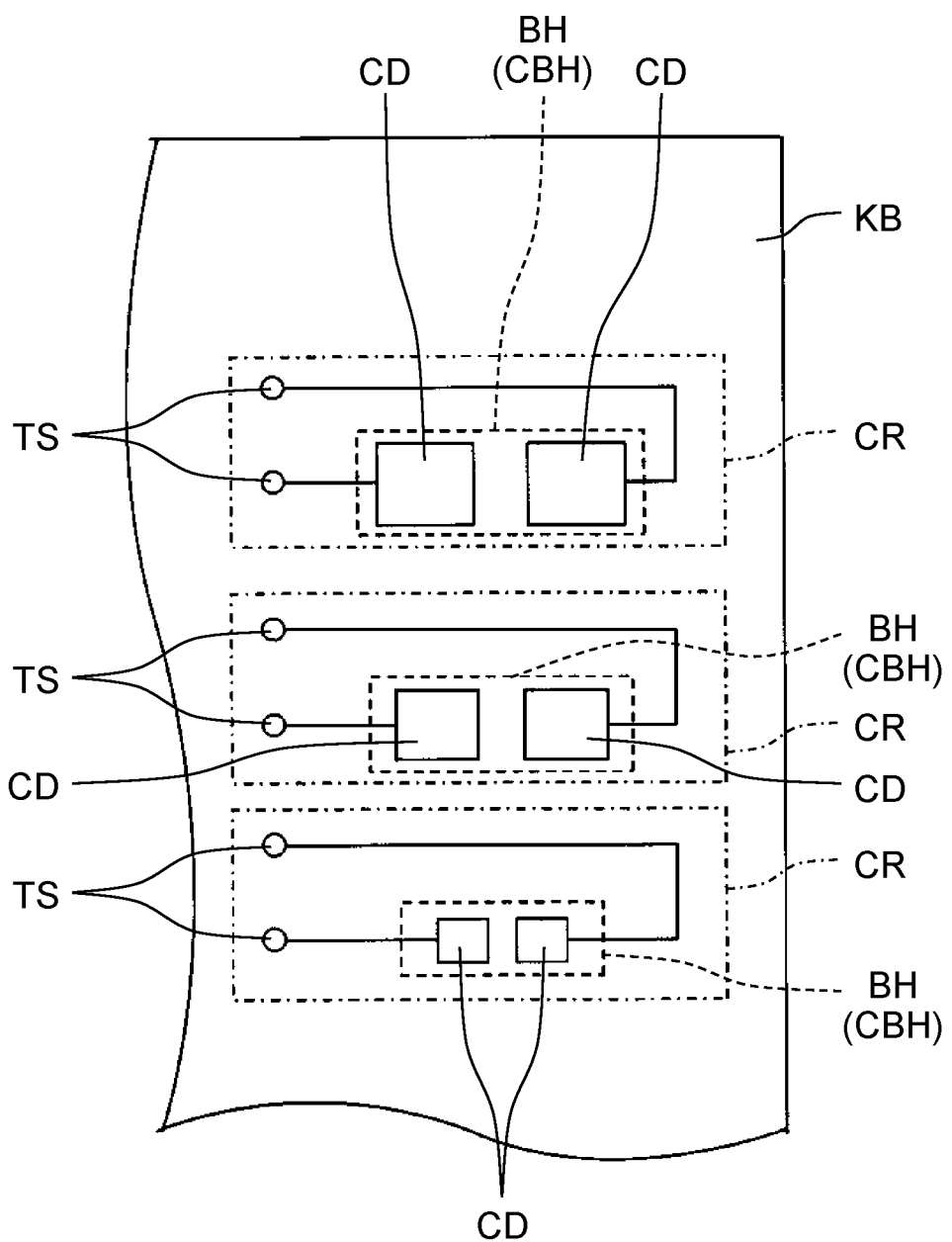
FIG. 3 is a plan view of a part of the board according to the exemplary embodiment.

As illustrated in FIG. 2, board KB handled in the present exemplary embodiment has not only product area PR in which pattern electrode PD incorporated in an electrical product is disposed, but also a plurality of inspection areas CR set as regions different from product area PR. As illustrated in FIG. 3, inspection electrode CD for inspecting electrical characteristics is disposed in each inspection area CR.

As illustrated in FIG. 2, component BH (illustrated by a one-dot chain line in the drawing) incorporated in the electrical product is installed in pattern electrodes PD. As illustrated in FIG. 3, on inspection electrode CD, among components BH installed in product area PR, component BH that requires inspection of electrical characteristics is installed as inspection-required component CBH (illustrated by a broken line in the drawing). Inspection terminal TS is connected to inspection electrode CD. In the present exemplary embodiment, as illustrated in FIG. 3, three inspection areas CR are provided such that three types of inspection-required component CBH having different sizes can be installed.

In FIG. 1, printing device 4 includes board transport conveyor 11, mask 12, and squeegee 13. Board transport conveyor 11 is installed so as to extend in the horizontal direction, and mask 12 is installed above board transport conveyor 11. Squeegee 13 is provided above mask 12. When board KB is put into printing device 4, printing device 4 operates board transport conveyor 11 to convey in board KB. Board KB is lifted up by a board lifting and lowering unit (not illustrated) and brought into contact with the lower surface of mask 12, and squeegee 13 is slid on mask 12.

When squeegee 13 slides on mask 12, the solder previously supplied on mask 12 is scraped by squeegee 13, and the solder is applied to the surface of board KB through the pattern opening provided in mask 12. At this time, the solder is applied to both pattern electrode PD in product area PR and inspection electrode CD in inspection area CR. When the solder is applied to board KB, the above-described board lifting and lowering unit lowers board KB and releases (separates) board KB from mask 12. When board KB is separated from mask 12, board transport conveyor 11 operates to convey out board KB to the downstream side (component mounter 5 positioned on the most upstream side among the plurality of component mounters 5).

Figure 4:
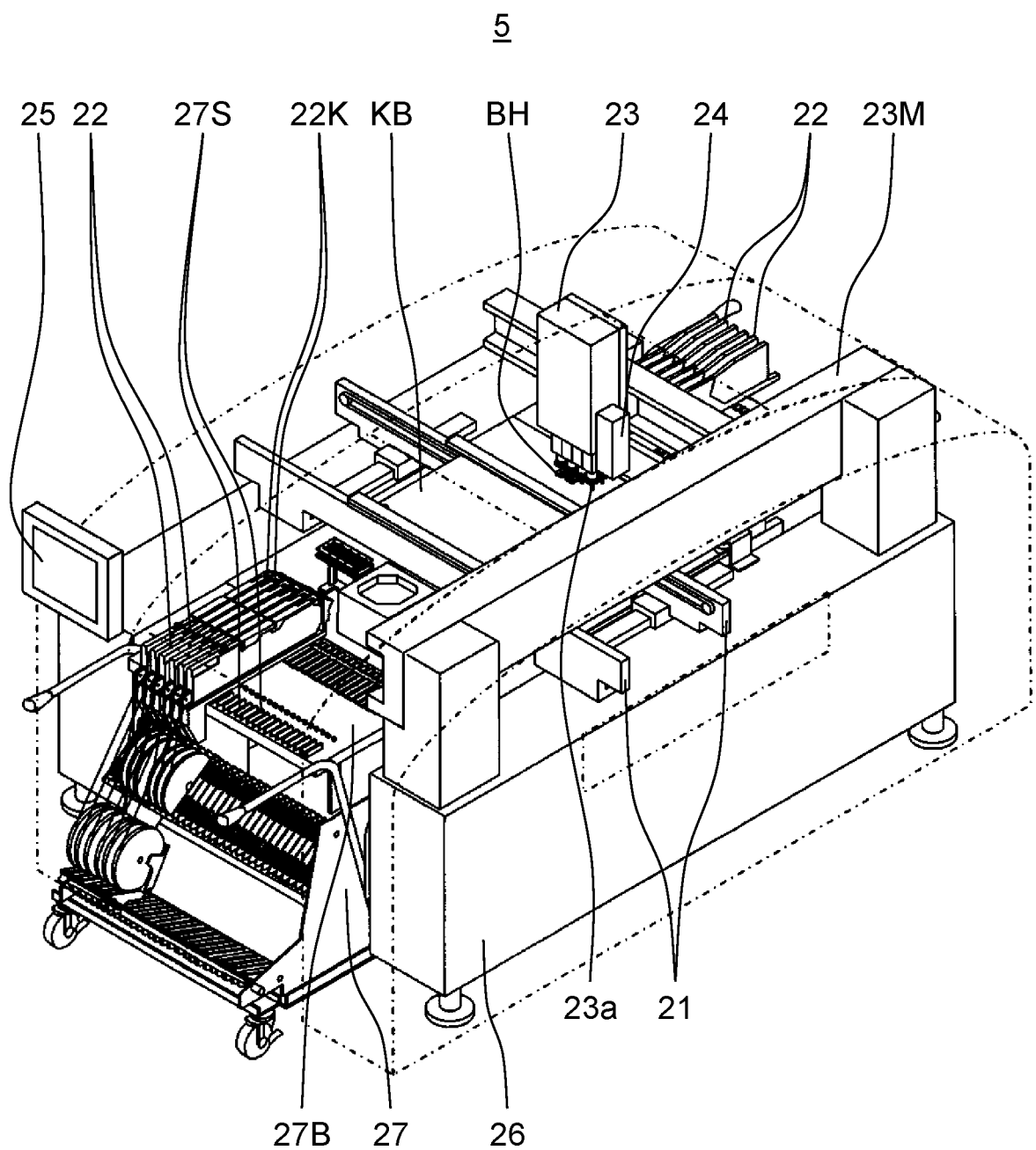
FIG. 4 is a perspective view of the component mounter according to the exemplary embodiment.

In FIG. 4, each component mounter 5 includes board transporter 21 configured having a pair of conveyors, a plurality of component feeders 22, installation head 23, board camera 24, and display device 25. Installation head 23 is moved within the horizontal plane by head moving mechanism 23M. Installation head 23 includes a plurality of nozzles 23a extending downward.

In FIG. 4, component feeder 22 is attached to feeder carriage 27 that is detachably connected to base 26 of component mounter 5. The plurality of component feeders 22 can be attached side by side to a plurality of slots 27S of feeder base 27B included in feeder carriage 27. Each component feeder 22 includes a connector (not illustrated), and when being installed on feeder base 27B, each component feeder 22 is connected to the connector (not illustrated) on feeder base 27B side. Component feeder 22 can communicate with mounter controller 30, which will be described later, via this connector. Here, component feeder 22 is a tape feeder for supplying component BH by the feeding operation of a tape containing component BH, and supplies component BH from component supply port 22K. Board camera 24 is attached to installation head 23 with an imaging visual field facing downward. Display device 25 is attached at an appropriate position visible to the operator.

Figure 5:
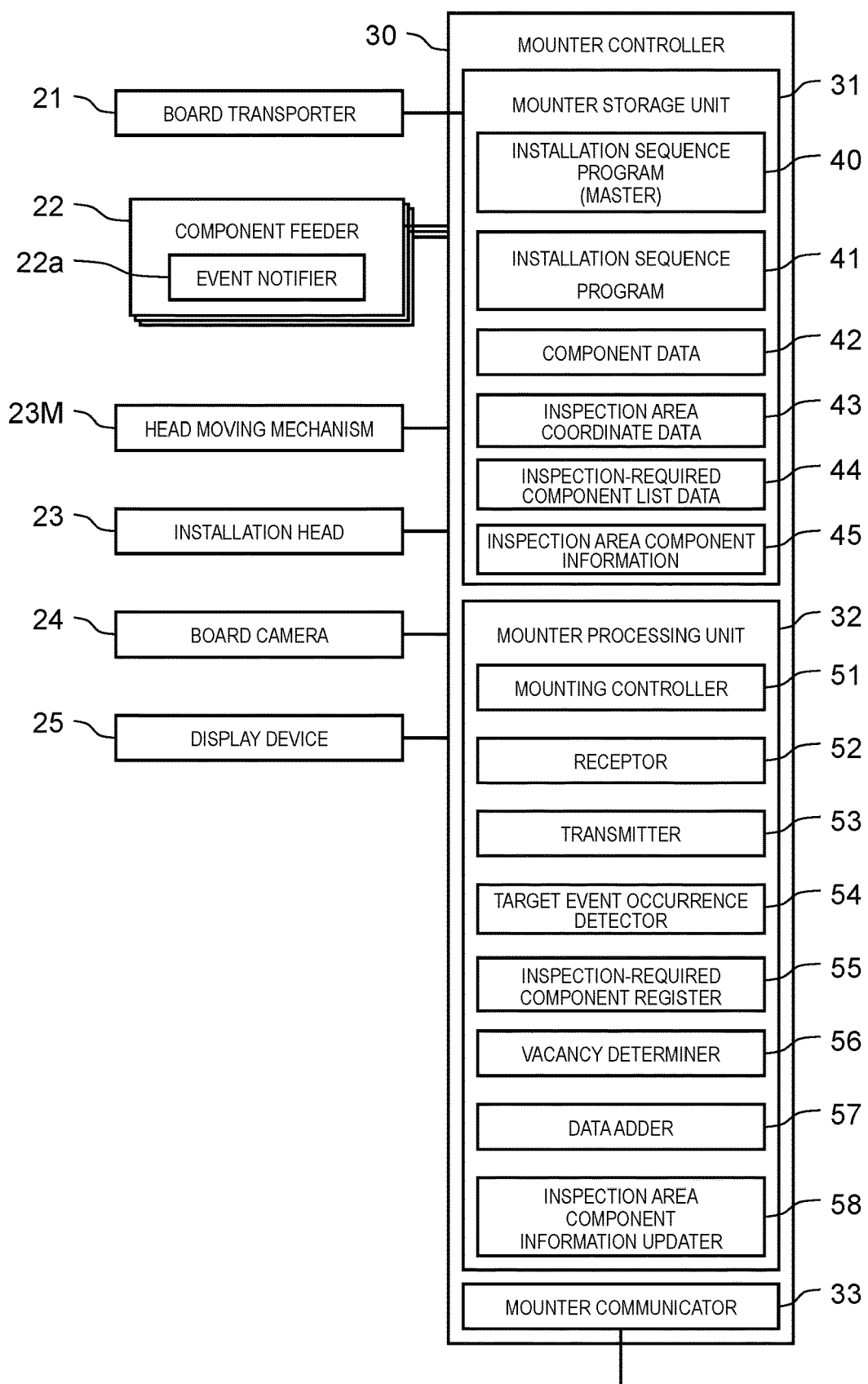
FIG. 5 is a block diagram illustrating a control system of the component mounter according to the exemplary embodiment.

In FIG. 5, mounter controller 30 included in component mounter 5 includes mounter storage unit 31, mounter processing unit 32, and mounter communicator 33. Mounter storage unit 31 stores production data required for the operation of component mounter 5. Specifically, installation sequence program (master) 40, installation sequence program 41, component data 42, inspection area coordinate data 43, inspection-required component list data 44, and inspection area component information 45 are stored. These production data are downloaded from management device 3. Mounter processing unit 32 includes mounting controller 51, receptor 52, transmitter 53, target event occurrence detector 54, inspection-required component register 55, vacancy determiner 56, data adder 57, and inspection area component information updater 58. The operation of display device 25 is controlled by mounter controller 30. All or a part of mounter processing unit 32 is configured with, for example, an integrated circuit. All or a part of the functions of mounter processing unit 32 may be realized by the processor included in component mounter 5 executing the program stored in mounter storage unit 31.

Installation sequence program 41 stored in mounter storage unit 31 is configured to include main data 41A indicating an operation order for installing component BH in product area PR of board KB (FIG. 6). Installation sequence program 41 is copied from installation sequence program (master) 40 each time board KB is conveyed in.

In FIG. 6, main data 41A of installation sequence program 41 includes each item of "sequence number", "nozzle number", "X", "Y", "θ", "component identification information", and "component supply position". Here, the "sequence number" is a serial number indicating the order in which the sequence operation of component installation is executed. "Nozzle number" is the number for identifying the plurality of nozzles 23a provided in installation head 23, component BH is installed on board KB by nozzle 23a having a nozzle number designated here.

In FIG. 6, "X" and "Y" are coordinate data indicating the position on board KB for installing component BH, and are X and Y coordinate values based on the XY orthogonal coordinate axes fixed to board KB with reference to the original position set on board KB. "θ" is a deviation angle from the reference direction (for example, the above-described X-axis) set on board KB. "Component identification information" is identification information individually given to each component BH. "Component supply position" is a position to which component BH is supplied in component mounter 5, and here, the identification number of slot 27S of feeder carriage 27 in which component feeder 22 is installed is designated.

Component data 42 stored in mounter storage unit 31 is data about component BH installed on board KB, and includes data referred to when component mounter 5 installs component BH, such as component identification information for identifying component BH, dimension data, or nozzle identification information of nozzle 23a used when installing the component to board KB. Furthermore, component data 42 includes electrical characteristic inspection flag 42A indicating whether or not it is necessary to perform inspection of electrical characteristics in a case where "event" has occurred with respect to component feeder 22 related to component BH (FIG. 7). Electrical characteristic inspection flag 42A is set to "1" for component BH that requires inspection of electrical characteristics, and is set to "0" for component BH that does not require inspection of electrical characteristics. Only the component (component BH in which electrical characteristic inspection flag 42A is "1") in which a flag indicating that requires inspection of electrical characteristics is set is handled as inspection-required component CBH.

Here, the above-described "event" means an event having a possibility that component BH to be supplied is switched in each component feeder 22. For example, the event corresponds to a case where component feeder 22 is reinstalled in feeder carriage 27 after the operator once removed component feeder 22 from feeder carriage 27 in order to change component BH to be supplied. The event corresponds to a case where feeding of the preceding tape is completed and the next tape is loaded in a case where component feeder 22 is an autoload type tape feeder. The event corresponds to a case where a connector for connecting the preceding tape and the next tape for replenishment to each other passes through component supply port 22K in a case of replenishing component BH to the tape feeder by the splicing method. When there is a possibility that an event occurs in component feeder 22 and component BH supplied by component feeder 22 is switched, it is necessary to confirm that component BH having a possibility of switching is correct as planned (or to confirm that component BH is not erroneous component BH), and therefore, it is necessary to inspect electrical characteristics for component BH.

Inspection area coordinate data 43 stored in mounter storage unit 31 is coordinate data indicating a component installation position set in each of three inspection areas CR included in each board KB. The coordinate data that configures each inspection area coordinate data 43 includes "X", "Y", and "θ", and is, for example, coordinate data of an intermediate point of a pair of inspection electrodes CD in each inspection area. Similar to the installation sequence programs "X", "Y", and "θ", the coordinate data is set with reference to the coordinate axes fixed to board KB with the original position set in board KB as the origin.

In a case where the above-described event occurs, inspection-required component list data 44 stored in mounter storage unit 31 is data in which component BH (component BH having a possibility of switching) related to the event is listed as inspection-required component CBH. Inspection-required component list data 44 is vacant data in the initial state, but every time an event is detected for component BH that requires inspection of electrical characteristics, component BH related to the detected event is listed up as inspection-required component CBH.

Figure 8:
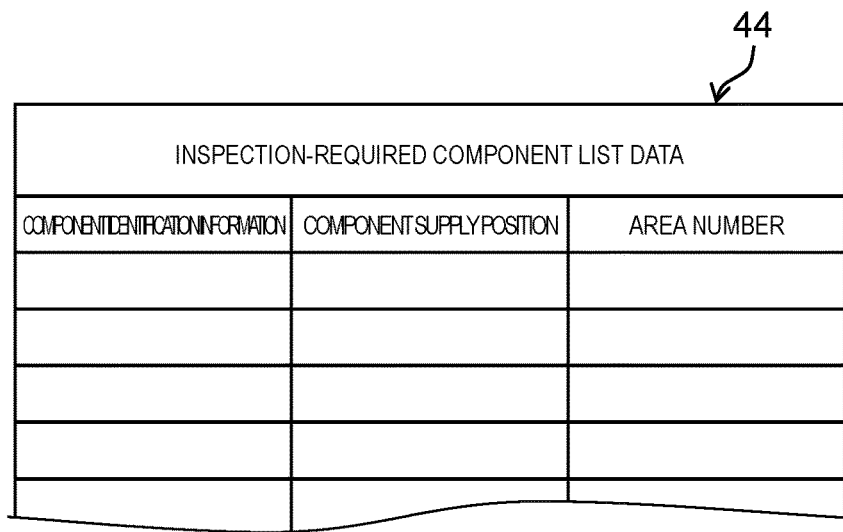
FIG. 8 is a view illustrating an image of inspection-required component list data stored in the mounter storage unit according to the exemplary embodiment.

In FIG. 8, inspection-required component list data 44 includes at least each item of "component identification information", "component supply position", and "area number" for the listed inspection-required component CBH. Here, "component identification information" and "component supply position" are as described above, and "area number" is the identification number (here, the number for identifying which inspection area CR is the inspection area CR among three inspection areas CR) of inspection area CR in which component BH is supposed to be installed. Which inspection area CR component BH is installed in is determined based on the dimension data included in component data 42.

Figure 9:
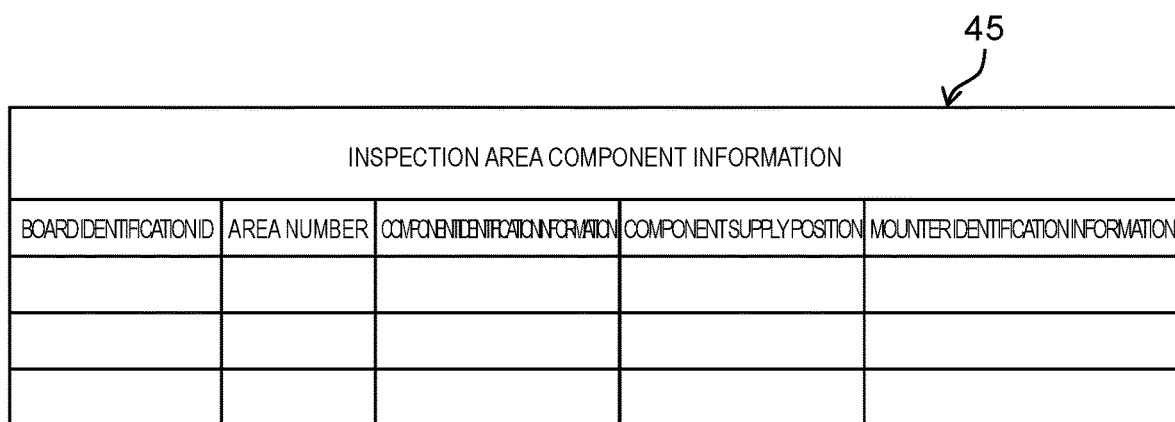
FIG. 9 is a view illustrating an image of inspection area component information stored in the mounter storage unit according to the exemplary embodiment.

Inspection area component information 45 is information on component BH (inspection-required component CBH) installed in inspection area CR for each board KB (FIG. 9). Inspection area component information 45 is information indicating whether or not inspection-required component CBH is installed in inspection area CR, that is, data indicating the information on vacancy of inspection area CR. Inspection area component information 45 is data which is created corresponding to each board KB put into mounting work unit 2, and has properties sequentially delivered to each component mounter 5 via management device 3 according to the flow of board KB.

As illustrated in FIG. 9, inspection area component information 45 includes each item of "board identification ID", "area number", "component identification information", "component supply position", and "mounter identification information". Here, "area number", "component identification information", and "component supply position" are information as described above. "Board identification ID" is unique identification information given to each board KB sequentially processed by component mounting system 1, and can be read from a bar code or the like provided on the surface of board KB.

Inspection area component information 45 is created for each "board identification ID". When management device 3 has created inspection area component information 45, component mounter 5 downloads created inspection area component information 45 from management device 3 and stores the downloaded inspection area component information 45. When management device 3 does not have created inspection area component information 45, component mounter 5 creates and stores new inspection area component information 45. Newly created inspection area component information 45 is vacant inspection area component information that does not include information related to inspection-required component CBH. When component mounter 5 installs lifted inspection-required component CBH in inspection area CR, as information indicating this (indicating that inspection-required component CBH is installed in inspection area CR), new "board identification ID", "area number", "component identification information", "component supply position", and "mounter identification information" are written and updated by inspection area component information updater 58 into inspection-required component list data 44. The updated inspection area component information 45 is uploaded to management device 3 and downloaded to the downstream component mounter 5. Therefore, inspection area component information 45 is inherited from upstream component mounter 5 to downstream component mounter 5 in accordance with the transport of board KB, and when inspection-required component CBH is installed in inspection area CR, inspection area component information 45 is updated by component mounter 5 in which inspection-required component CBH is installed.

Mounting controller 51 controls operations of each unit included in component mounter 5 such that component BH is installed in product area PR, based on main data 41A in installation sequence program 41 stored in mounter storage unit 31. Accordingly, corresponding components BH are installed one by one on each pattern electrode PD of product area PR of board KB conveyed in to component mounter 5.

Receptor 52 downloads installation sequence program 41, inspection area component information 45, and the like from management device 3 through mounter communicator 33. Downloaded installation sequence program 41, inspection area component information 45, and the like are stored in mounter storage unit 31 as described above. Transmitter 53 uploads above-described updated inspection area component information 45 to management device 3 through mounter communicator 33, in management device 3.

Component feeder 22 includes event notifier 22a for notifying mounter controller 30 of the occurrence of an event. Event notifier 22a transmits the event notification indicating that component feeder 22 is installed when component feeder 22 is installed on feeder base 27B, to mounter controller 30. Accordingly, mounter controller 30 can detect the event that component feeder 22 is installed. In a case where component feeder 22 is an autoload type tape feeder, event notifier 22a performs event notification indicating that the loading is completed to mounter controller 30 when the feeding of the preceding tape is completed and the next tape is loaded. Furthermore, in a case of a tape feeder for replenishing component BH by the splicing method, the built-in sensor (not illustrated) detects the connector, and when the tape is fed a predetermined distance after the detection, event notifier 22a performs event notification to mounter controller 30. When the connector passes through component supply port 22K, event notifier 22a performs event notification because the preceding tape is switched to the next tape. Event notifier 22a may perform the event notification by outputting information, such as identification information of component feeder 22 or component identification information of a component supplied by component feeder 22, to mounter controller 30.

Target event occurrence detector 54 included in mounter processing unit 32 detects whether or not the event notification is related to inspection-required component CBH among the event notifications notified from event notifier 22a. Specifically, target event occurrence detector 54 specifies component identification information of component BH supplied by component feeder 22 based on slot 27S (component supply position) in which component feeder 22 that has sent the event notification is installed, and installation sequence program 41. Electrical characteristic inspection flag 42A of the component identification information is confirmed by component data 42, and when the electrical characteristic inspection flag 42A is "1", it is determined that the target event related to inspection-required component CBH has occurred. It is needless to say that, when the event notification includes the component identification information, electrical characteristic inspection flag 42A can be referred to in component data 42.

In this manner, in the present exemplary embodiment, target event occurrence detector 54 of mounter controller 30 is target event occurrence detecting means for detecting that an event (hereinafter, described as target event) that requires inspection of electrical characteristics for component BH supplied by component feeder 22 has occurred.

When target event occurrence detector 54 detects that the target event has occurred, inspection-required component register 55 writes (lists) component BH related to the detected target event as inspection-required component CBH into inspection-required component list data 44. Specifically, "component identification information", "component supply position", and "area number" of inspection-required component CBH are written into inspection-required component list data 44.

When inspection-required component register 55 writes the data related to inspection-required component CBH into inspection-required component list data 44, vacancy determiner 56 determines whether or not inspection area CR that corresponds to inspection-required components CBH listed in inspection-required component list data 44 is vacant. Specifically, it is determined whether or not inspection area CR of the area number written into inspection-required component list data 44 is vacant, from inspection area component information 45. In a case where the same area number as that of inspection area CR where inspection-required components CBH are planned to be installed is already present in inspection area component information 45, or in a case where the component identification information is written together with the same area number as that of inspection area component information 45, it is determined that inspection area CR is not vacant. In a case where vacancy determiner 56 determined that inspection area CR is vacant, data adder 57 creates data for installing inspection-required component CBH in inspection area CR as additional data 41B, and adds created additional data 41B to installation sequence program 41 (FIG. 6→FIG. 10, data of sequence number "7" illustrated in FIG. 10).

In this manner, in the present exemplary embodiment, vacancy determiner 56 of mounter controller 30 is a determination means for determining whether or not inspection area CR is vacant. In the present exemplary embodiment, data adder 57 of mounter controller 30 is data adding means for adding additional data 41B for installing inspection-required component CBH in inspection area CR to installation sequence program 41, in a case where target event occurrence detector 54 detects that the target event has occurred and vacancy determiner 56 determines that inspection area CR is vacant. In a case of the added "X", "Y", and "θ", the coordinate data of inspection area CR specified by the area number is read from inspection area coordinate data 43.

Mounting controller 51 operates installation head 23 based on main data 41A of installation sequence program 41 to install component BH in product area PR. When additional data 41B is added to installation sequence program 41, mounting controller 51 operates installation head 23 based on additional data 41B to install inspection-required component CBH in inspection area CR. When inspection-required component CBH is installed in inspection area CR, inspection area component information updater 58 writes this (inspection-required component CBH is installed in inspection area CR) into inspection area component information 45 to update inspection area component information 45. Specifically, inspection area component information updater 58 writes the component identification information of inspection-required component CBH installed in inspection area CR, board identification ID of board KB on which inspection-required component CBH is installed, the area number of inspection area CR, and identification number (component supply position) of slot 27S in which component feeder 22 that has supplied inspection-required component CBH is installed, into inspection area component information 45.

In this manner, in the present exemplary embodiment, in a case where inspection-required component CBH is installed in inspection area CR, inspection area component information updater 58 of mounter controller 30 is inspection area component information updating means for updating inspection area component information 45 by writing information indicating that inspection-required component CBH is installed in inspection area CR into inspection area component information 45. Mounter storage unit 31 is storage means for storing component BH that requires inspection of electrical characteristics as inspection-required component CBH (for storing inspection-required component list data 44), in a case where target event that requires inspection of electrical characteristics for component BH supplied by component feeder 22 has occurred. An example of storage means is a memory such as a hard disk drive or a solid state drive.

In the present exemplary embodiment, receptor 52 of mounter controller 30 is receiving means for receiving inspection area component information 45 in which the installed state of inspection-required component CBH in inspection area CR is recorded, from external management device 3. Vacancy determiner 56, which is a determination means, determines whether or not inspection area CR is vacant based on inspection area component information 45 received by receptor 52. Transmitter 53 of mounter controller 30 is inspection area component information transmitting means for transmitting inspection area component information 45 updated by inspection area component information updater 58 which is inspection area component information updating means, to management device 3.

Mounter communicator 33 exchanges information with management device 3, which is an external device viewed from component mounter 5. By exchanging information with management device 3 through mounter communicator 33, as described above, component mounter 5 downloads data (installation sequence program 41 and inspection area component information 45) stored in management device 3 or uploads data (updated inspection area component information 45) required to be stored in management device 3 in management device 3.

When board KB is fed from the upstream side of the flow of board KB, each component mounter 5 conveys in board KB by operating board transporter 21, and positions board KB at a predetermined working position. At this time, board identification ID is read from conveyed-in board KB, and mounter controller 30 downloads inspection area component information 45 including board identification ID from management device 3 and stores the downloaded information in mounter storage unit 31.

Inspection area component information 45 downloaded at the time that component mounter 5 conveys in board KB includes information which is written in all component mounters 5 positioned on the upstream side of component mounters 5 and indicates that installation of inspection-required component CBH in inspection area CR is completed. Therefore, component mounter 5 can detect which inspection area CR of conveyed-in board KB is vacant, with reference to downloaded inspection area component information 45. Among the plurality of component mounters 5, component mounter 5 positioned on the most upstream side creates vacant inspection area component information 45 in component mounter 5 itself since inspection area component information 45 downloaded from management device 3 does not exist.

When board KB is conveyed in, component mounter 5 positions board KB at a predetermined working position. Mounting controller 51 included in a processing unit (mounter processing unit 32) of mounter controller 30 repeatedly executes the installation turn (operation of installing component BH on board KB by picking up component BH supplied by component feeder 22) for installing component BH in product area PR, based on main data 41A in installation sequence program 41 stored in mounter storage unit 31.

In each installation turn, each component feeder 22 performs an operation of supplying component BH to component supply port 22K, and after installation head 23 picks up component BH by nozzle 23a, installation head 23 moves above board KB, lowers nozzle 23a, and installs component BH on board KB (pattern electrode PD in product area PR).

While component mounter 5 installs component BH in product area PR based on installation program 41 (main data 41A), a state of being out of components or nearly out of components in any of the plurality of component feeders 22 is achieved, and the above-described event occurs. Among the events, in a case of an event that occurred for inspection-required component CBH, target event occurrence detector 54 detects the target event. When target event occurrence detector 54 detects that the target event has occurred, data adder 57 creates additional data 41B, and adds the created additional data 41B below main data 41A of installation sequence program 41 stored in mounter storage unit 31 (that is, at the end of installation sequence program 41) (FIG. 6→FIG. 10). After installation head 23 controlled by mounter controller 30 repeatedly executes the installation turn to install component BH in product area PR of board KB, based on additional data 41B added to installation sequence program 41, inspection-required component CBH is installed in inspection area CR.

In this manner, in the present exemplary embodiment, in a case where vacancy determiner 56, which is a determination means, determines that inspection area CR is vacant, installation head 23 functions as inspection-required component installing means for installing component BH picked up from component feeder 22 as inspection-required component CBH in inspection area CR.

When inspection-required component CBH is installed in inspection area CR, component mounter 5 writes the information indicating that the installation is completed into inspection area component information 45 to update inspection area component information 45. When installation of inspection-required component CBH in inspection area CR is completed, board transporter 21 is operated to convey out board KB to the downstream side, and updated inspection area component information 45 is uploaded to management device 3.

In this manner, each of the plurality of component mounters 5 in the present exemplary embodiment is configured to convey in board KB having product area PR in which pattern electrode PD incorporated in the electrical product is disposed and inspection area CR in which inspection electrode CD for inspecting the electrical characteristics is disposed, and to convey out board KB after repeatedly executing an operation of picking up component BH supplied by component feeder 22 and installing the component in product area PR according to installation sequence program 41. Furthermore, each of the plurality of component mounters 5 is configured to include target event occurrence detector 54 for detecting occurrence of an event that requires inspection of the electrical characteristics with respect to component BH supplied by component feeder 22, vacancy determiner 56 (determination means) for determining whether or not inspection area CR is vacant, and installation head 23 (inspection-required component installing means). In a case where target event occurrence detector 54 detects that an event has occurred and vacancy determiner 56 determines that inspection area CR is vacant, installation head 23 installs component BH picked up from component feeder 22 in inspection area CR as inspection-required component CBH. With this configuration, component BH (inspection-required component CBH) that requires inspection of the electrical characteristics for component BH supplied by component feeder 22 can be installed in inspection area CR which is an area different from product area PR on board KB.

Component mounter 5 (first component mounter) excluding component mounters 5 positioned on the most upstream side and the most downstream side from the plurality of component mounters 5 conveys in board KB from the device on the upstream side, and conveys out board KB after repeatedly executing the operation of picking up component BH supplied by the component feeder 22 and installing the picked-up component BH in product area PR. Furthermore, the first component mounter includes mounter storage unit 31 (storage means) for storing a component that requires inspection of electrical characteristics in a case where the target event has occurred for component BH supplied by component feeder 22 as inspection-required component, and receiving means (receptor 52) for receiving inspection area component information in which the installed state of inspection-required component CBH in inspection area CR is recorded. Furthermore, the first component mounter includes above-described vacancy determiner 56 (reversing means), installation head 23 (inspection-required component installing means), inspection area component information updater 58 (inspection area component information updating means), and transmitter 53 (inspection area component information transmitting means). With this configuration, component BH (inspection-required component CBH) that requires inspection of the electrical characteristics for component BH supplied by component feeder 22 can be installed in inspection area CR which is an area different from product area PR on board KB.

Component mounter 5 (second component mounter) positioned on the most upstream side among the plurality of component mounters 5 conveys in board KB, and conveys out board KB after repeatedly executing the operation of picking up component BH supplied by the component feeder 22 and installing picked-up component BH in product area PR. Furthermore, the second component mounter includes above-described mounter storage unit 31 (storage means), installation head 23 (inspection-required component installing means), inspection area component information updater 58 (inspection area component information updating means), and transmitter 53 (inspection area component information transmitting means). With this configuration, component BH (inspection-required component CBH) that requires inspection of the electrical characteristics for component BH supplied by component feeder 22 can be installed in inspection area CR which is an area different from product area PR on board KB.

Component mounter 5 (third component mounter) positioned on the most downstream side among the plurality of component mounters 5 conveys in board KB from the device on the upstream side, and conveys out board KB after repeatedly executing the operation of picking up component BH supplied by the component feeder 22 and installing the picked-up component BH in product area PR. Furthermore, the third component mounter includes above-described mounter storage unit 31 (storage means), receptor 52 (receiving means), vacancy determiner 56 (determination means), installation head 23 (inspection-required component installing means), and inspection area component information updater 58 (inspection area component information updating means). With this configuration, component BH (inspection-required component CBH) that requires inspection of the electrical characteristics for component BH supplied by component feeder 22 can be installed in inspection area CR which is an area different from product area PR on board KB.

In this manner, in component mounter 5 in the present exemplary embodiment, component BH (inspection-required component CBH) that requires inspection of the electrical characteristics for component BH supplied by component feeder 22 can be installed in inspection area CR which is an area different from product area PR on board KB. Therefore, after inspection-required component CBH is moved together with board KB and the installation work of component BH by all component mounters 5 is completed, one characteristic inspection means (here, characteristic inspection device 8) can inspect electrical characteristics of inspection-required component CBH, and thus, it is not necessary to install an expensive characteristic checker for performing inspection of electrical characteristics of component BH in each component mounter, and the cost can be reduced.

In FIG. 1, reflow furnace 6 includes a pair of feed conveyors 6C, heater 6H, and cooler 6L. Cooler 6L is provided to be positioned on the downstream side of heater 6H. In reflow furnace 6, reflow furnace 6 receives board KB from the upstream side (component mounter 5 positioned on the most downstream side among the plurality of component mounters 5) and transports board KB toward the downstream side by feed conveyor 6C. During this time, after board KB is heated by heater 6H, board KB is cooled by cooler 6L. Accordingly, the solder melts and then solidifies, and component BH installed by component mounter 5 is fixed on board KB.

In FIG. 1, appearance inspection device 7 includes transport conveyor 61 and inspection camera 62. Inspection camera 62 has an imaging visual field facing downward and is moved by camera moving mechanism 62M. When board KB is fed from the upstream side (reflow device 6), appearance inspection device 7 conveys in board KB by operating board transporter 21, and board KB is positioned at a predetermined working position. The appearance inspection is executed with respect to conveyed-in board KB based on the data of operation order downloaded and obtained from management device 3. Specifically, camera moving mechanism 62M operates to move inspection camera 62 above board KB, and inspection camera 62 images board KB. Accordingly, when the appearance inspection of board KB is completed, transport conveyor 61 operates to convey out board KB to the downstream side.

Figure 11:
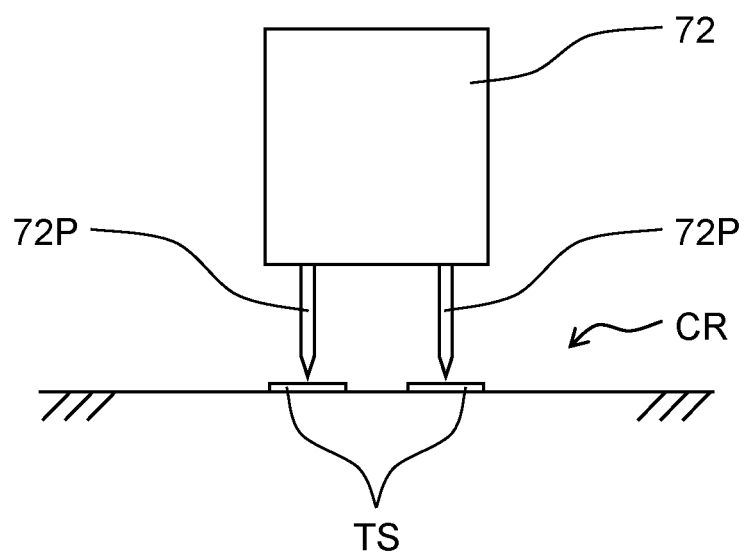
FIG. 11 is a view illustrating a state where electrical characteristics are inspected by a characteristic inspection device according to the exemplary embodiment.
Figure 12:
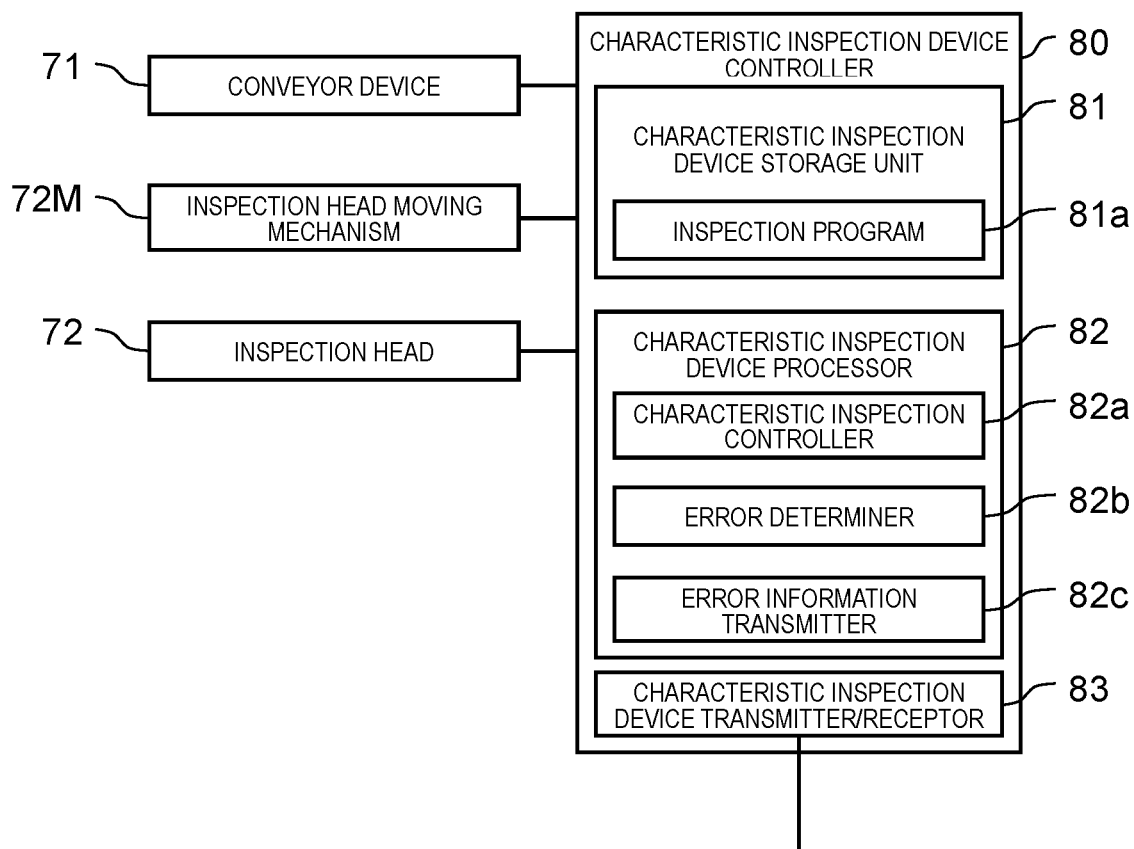
FIG. 12 is a block diagram illustrating a control system of the characteristic inspection device according to the exemplary embodiment.

In FIG. 1, characteristic inspection device 8 includes conveyor device 71 and inspection head 72. As illustrated in FIG. 11, inspection head 72 includes a pair of inspection pins 72P protruding downward, and is moved by inspection head moving mechanism 72M. In FIG. 12, characteristic inspection device controller 80 included in characteristic inspection device 8 includes characteristic inspection device storage unit 81, characteristic inspection device processing unit 82, and characteristic inspection device transmitter/receptor 83. Inspection program 81a is stored in characteristic inspection device storage unit 81. Characteristic inspection device processing unit 82 includes characteristic inspection controller 82a, error determiner 82b, and error information transmitter 82c. All or a part of characteristic inspection device controller 80 is configured with, for example, an integrated circuit. All or a part of the functions of characteristic inspection device controller 80 may be realized by the processor included in characteristic inspection device 8 executing the program stored in characteristic inspection device storage unit 81.

Inspection program 81a stored in characteristic inspection device storage unit 81 is a program that defines in what order the inspection (inspection of electrical characteristics) is performed with respect to conveyed-in board KB.

Characteristic inspection controller 82a included in the characteristic inspection device processing unit executes characteristic inspection (inspection of electrical characteristics) with respect to conveyed-in board KB based on inspection program 81a. Error determiner 82b determines whether or not component BH is an error component based on whether or not the obtained value of electrical characteristics is within the reference range as a result of executing the inspection with respect to component BH (inspection-required component CBH) installed in inspection area CR by characteristic inspection controller 82a. Here, "error component" refers to a component of which the obtained value of electrical characteristic is not within the reference range as a result of performing inspection of electrical characteristics.

As a result of inspection of electrical characteristics, component BH (inspection-required component CBH) determined to be an error component means erroneous component BH that is not supposed to be originally supplied. Accordingly, in a case where there is component BH (inspection-required component CBH) determined to be an error component by error determiner 82b, error information transmitter 82c of characteristic inspection device 8 transmits information (board identification ID of board KB on which the error component is installed and the area number of inspection area CR) about inspection-required component CBH for which the error determination was made, as error information, to management device 3.

In this manner, in the present exemplary embodiment, error determiner 82b of characteristic inspection device controller 80 serves as an error determination means for determining whether or not inspection-required component CBH installed in inspection area CR is an error component. Error information transmitter 82c of characteristic inspection device controller 80 serves as error information transmitting means for transmitting information on inspection-required component CBH determined to be an error component by error determiner 82b, which is an error determination means, to the management device as error information.

Figure 13:
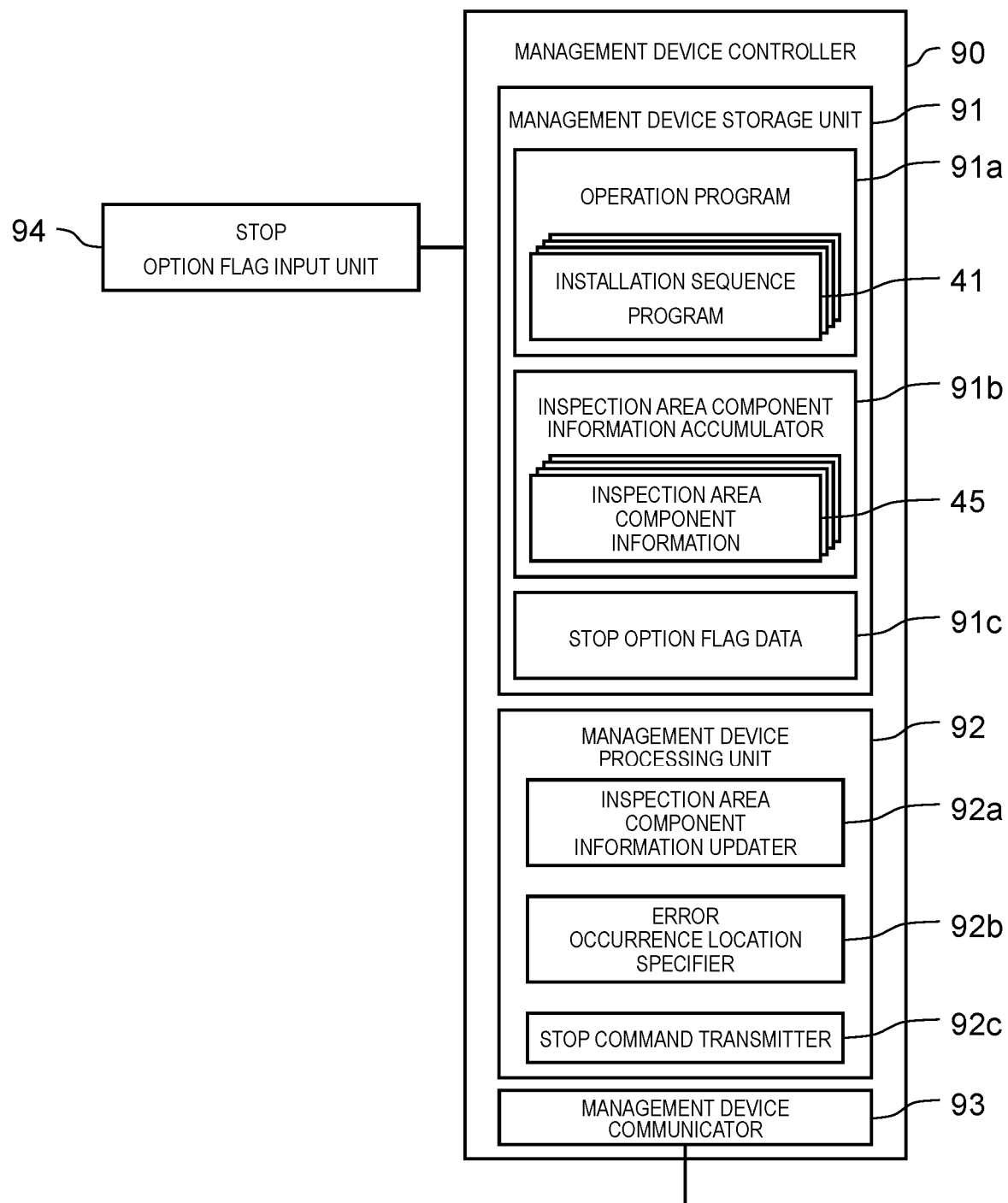
FIG. 13 is a block diagram illustrating a control system of a management device according to the exemplary embodiment.

In FIG. 13, management device controller 90 included in management device 3 includes management device storage unit 91, management device processing unit 92, and management device communicator 93. In management device storage unit 91, each operation program (reference numeral is 91a) of each device (printing device 4, the plurality of component mounters 5, reflow furnace 6, appearance inspection device 7, and characteristic inspection device 8) that configures mounting work unit 2 is stored, and additionally, inspection area component information accumulator 91b and stop option flag data 91c are stored. Management device processing unit 92 includes inspection area component information updater 92a, error occurrence location specifier 92b, and stop command transmitter 92c. Management device communicator 93 is connected to each device that configures mounting work unit 2, and transmits and receives various signals to and from each of these devices. All or a part of management device processing unit 92 is configured with, for example, an integrated circuit. All or a part of the functions of management device processing unit 92 may be realized by the processor included in management device 3 executing the program stored in management device storage unit 91.

As described above, operation program 91a stored in management device storage unit 91 is data that defines the operation order and the like of each device that configures mounting work unit 2. Operation program 91a includes installation sequence program 41 corresponding to each component mounter 5 (FIG. 13).

Figure 14:
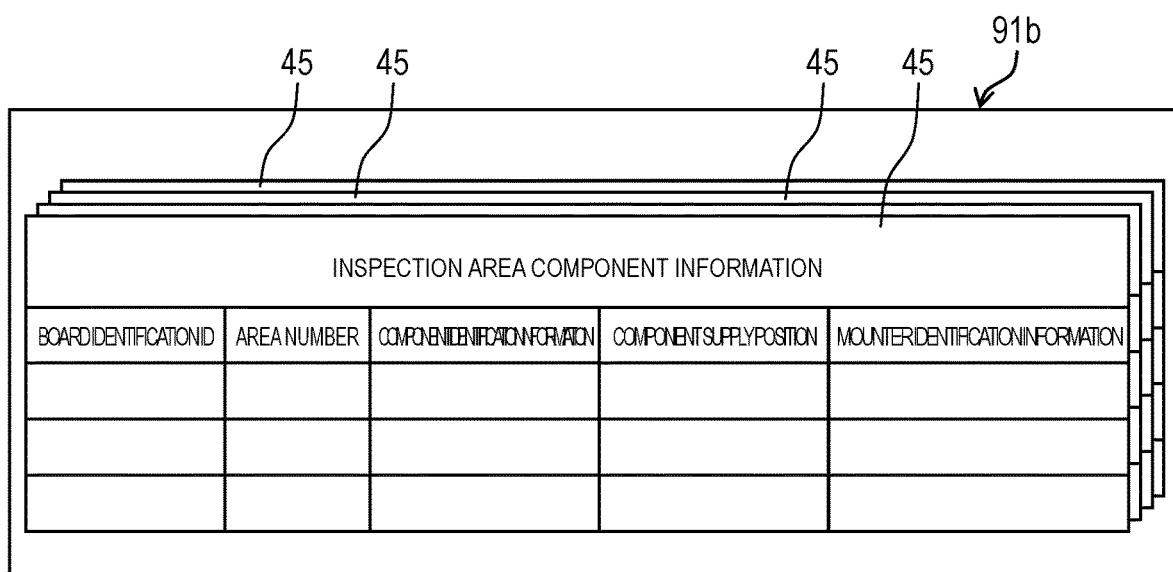
FIG. 14 is a view illustrating an image of the inspection area component information stored in a management device storage unit according to the exemplary embodiment.
Figure 15:
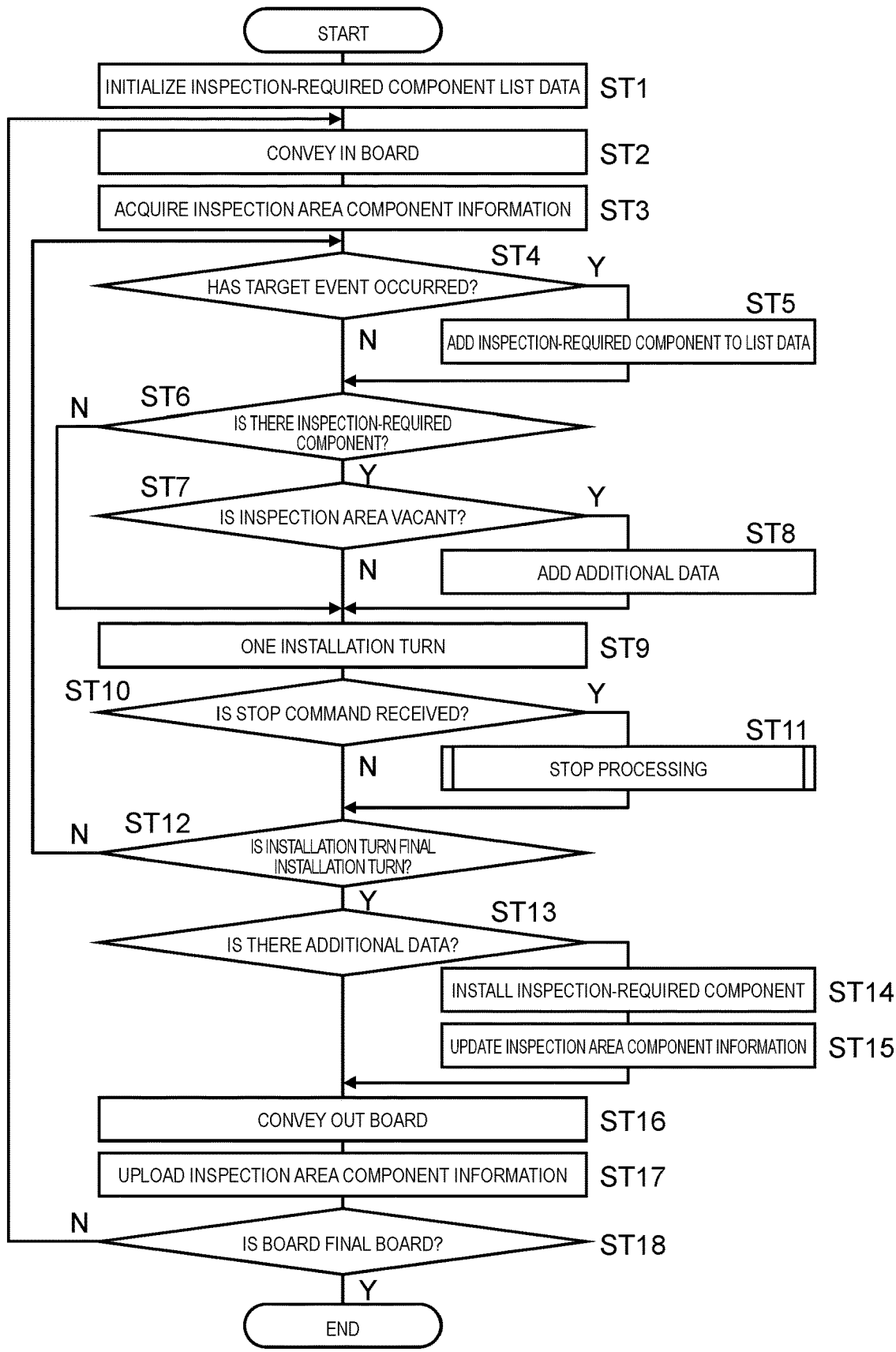
FIG. 15 is a flowchart of a main routine illustrating a processing procedure in the component mounter according to the exemplary embodiment.

Inspection area component information accumulator 91b stored in management device storage unit 91 is data that summarizes the latest inspection area component information 45 for each board KB (FIGS. 13 and 14). Inspection area component information accumulator 91b adds inspection area component information 45 for board KB each time board KB is put into component mounting system 1. When inspection area component information 45 is uploaded from each component mounter 5, based on uploaded inspection area component information 45, inspection area component information 45 in inspection area component information accumulator 91b is updated.

Stop option flag data 91c stored in management device storage unit 91 is a flag of an option that can designate which range of operations of component mounters 5 among the plurality of component mounters 5 is to be stopped, in a case where the error component is detected in characteristic inspection device 8. Specifically, the flag (stop option flag) can designate whether to stop only the operation of component mounter 5 (error component mounter) in which the error component is mounted (single stop), or to stop the operations of all component mounters 5 positioned on the downstream side in addition to error component mounter (interlocking stop). In FIG. 13, stop option flag input unit 94 is connected to management device 3, and the operator can input (change) the data of the stop option flag from the stop option flag input unit 94, and can designate one of the single stop and the interlocking stop.

Inspection area component information updater 92a included in management device processing unit 92 updates inspection area component information 45 accumulated in inspection area component information accumulator 91b based on inspection area component information 45 uploaded from each component mounter 5. Specifically, among the plurality of pieces of inspection area component information 45 accumulated in inspection area component information accumulator 91b, inspection area component information 45 having the same board identification ID as board identification ID included in inspection area component information 45 uploaded from each component mounter 5 is updated. Each component mounter 5 transmits board identification ID read when board KB is conveyed in to management device 3, and requests the transmission of inspection area component information 45 including corresponding board identification ID. Management device 3 downloads the requested inspection area component information 45 to component mounter 5. Accordingly, in each component mounter 5, it is possible to obtain information on vacancy of inspection area CR, that is, information indicating which inspection area CR component BH (inspection-required component CBH) is already installed in on board KB conveyed in, and which inspection area CR is vacant.

Error occurrence location specifier 92b specifies component mounter 5 in which component BH (inspection-required component CBH) determined to be an error component based on the error information fed from characteristic inspection device 8 is installed in inspection area CR, and component feeder 22 that has supplied the error component. Specifically, error occurrence location specifier 92b searches inspection area component information 45 accumulated in inspection area component information accumulator 91b by board identification ID included in the error information and the area number of inspection area CR. By reading "mounter identification information" and "component supply position" of inspection area component information 45 extracted by the search, error occurrence location specifier 92b specifies component mounter 5 in which component BH (inspection-required component CBH) determined to be an error component is installed in inspection area CR as "error component mounter", and specifies component feeder 22 that has supplied the error component as "error component supply component feeder".

In this manner, in the present exemplary embodiment, error occurrence location specifier 92b included in management device 3 is error occurrence location specifying means for specifying component mounter 5 in which inspection-required component CBH determined to be an error component is installed in inspection area CR as an error component mounter, based on the error information transmitted by error information transmitter 82c of characteristic inspection device 8 which is the error information transmitting means.

Stop command transmitter 92c transmits a stop command to component mounter 5 (that is, the error component mounter) specified by error occurrence location specifier 92b. At this time, in management device storage unit 91, in a case where stop option flag data 91c for designating "single stop" is set, a stop command is transmitted only to the error component mounter, and in a case where stop option flag data 91c for designating "interlocking stop" is set, a stop command is transmitted not only to the error component mounter but also to all component mounters 5 positioned on the downstream side of the error component mounter.

Component mounter 5 that has received the stop command from management device 3 stops the operation. Therefore, it is possible to prevent component BH determined to be an error component by characteristic inspection device 8 from being continuously installed on board KB thereafter and the number of defective boards on which the error component is installed from increasing. In this manner, in the present exemplary embodiment, stop command transmitter 92c included in management device 3 is stop means for stopping the operation of component mounter 5 specified as an error component mounter by error occurrence location specifier 92b which is the error occurrence location specifying means.

Component mounter 5 that has received the stop command from management device 3 and stopped the operation displays information indicating that the operator can take an appropriate action on display device 25, by controlling display device 25 from mounter controller 30. Specifically, information of an error component or information of component feeder 22 (error component supply component feeder) which has supplied the error component, or both of these information, are displayed. In this manner, in the present exemplary embodiment, display device 25 included in each component mounter 5 is display means for displaying at least one of the information of the error component and the information of component feeder 22 which has supplied the error component. An example of the display means is a display such as a liquid crystal display.

Next, the operations of each component mounter 5, characteristic inspection device 8, and management device 3 that configure component mounting system 1 will be described with reference to the flowcharts of FIGS. 15, 16, 17, and 18. First, the flow of component installation work (component mounting method) by component mounter 5 will be described with reference to FIGS. 15 and 16. When mounting work unit 2 starts the production of mounting board JKB, component mounter 5 first initializes inspection-required component list data 44 (step ST1 in the main routine of FIG. 15). After initializing inspection-required component list data 44, component mounter 5 conveys in board KB and reads the board identification information of board KB by a provided bar code reader (step ST2). Component mounter 5 downloads inspection area component information 45 having the same board identification information as the read board identification information, from management device 3. At this time, in a case where there is no inspection area component information 45 of the board identification information corresponding to management device 3, inspection area component information updater 58 creates vacant inspection area component information 45. Accordingly, the downloaded or created inspection area component information 45 is stored in mounter storage unit 31 (step ST3).

When respectively downloading installation sequence program 41 and inspection area component information 45 from management device 3, component mounter 5 repeatedly executes the installation turn for installing component BH on board KB based on main data 41A in installation sequence program 41. In the installation turn, first, target event occurrence detector 54 determines whether or not the target event is currently occurring (step ST4, target event occurrence detecting step). In a case where the target event has occurred, inspection-required component CBH that requires inspection of electrical characteristics due to the occurrence of event is added to inspection-required component list data 44 (step ST5), and the process proceeds to the next step ST6. Meanwhile, in a case where the target event has not occurred in step ST4, the process proceeds from step ST4 to step ST6.

In step ST6, component mounter 5 checks whether or not there is inspection-required component CBH currently listed in inspection-required component list data 44, with reference to inspection-required component list data 44. As a result, in a case where there is inspection-required component CBH listed in the inspection-required component list data, it is determined whether or not inspection area CR corresponding to inspection-required component CBH is vacant, with reference to inspection area component information 45 downloaded or created in step ST3 (step ST7, determining step).

In a case where inspection area CR is vacant as a result of the determination in step ST7, component mounter 5 adds additional data 41B for installing inspection-required component CBH in inspection area CR, to installation sequence program 41 stored in mounter storage unit 31 (step ST8). When step ST8 is completed, component mounter 5 executes one installation turn into product area PR based on installation sequence program 41 (step ST9). Meanwhile, in a case where there is no inspection-required component CBH listed in inspection-required component list data in step ST6, or in a case where inspection area CR corresponding to inspection-required component CBH is not vacant even in a case where there is inspection-required component CBH, the process proceeds from step ST6 to step ST9, and one installation turn into product area PR based on main data 41A is executed.

After executing one installation turn in step ST9, component mounter 5 checks whether or not a stop command has been received from management device 3 (step ST10). In a case where the stop command is received, the process enters the subroutine of the stop processing (step ST11, flowchart of FIG. 16).

Figure 16:
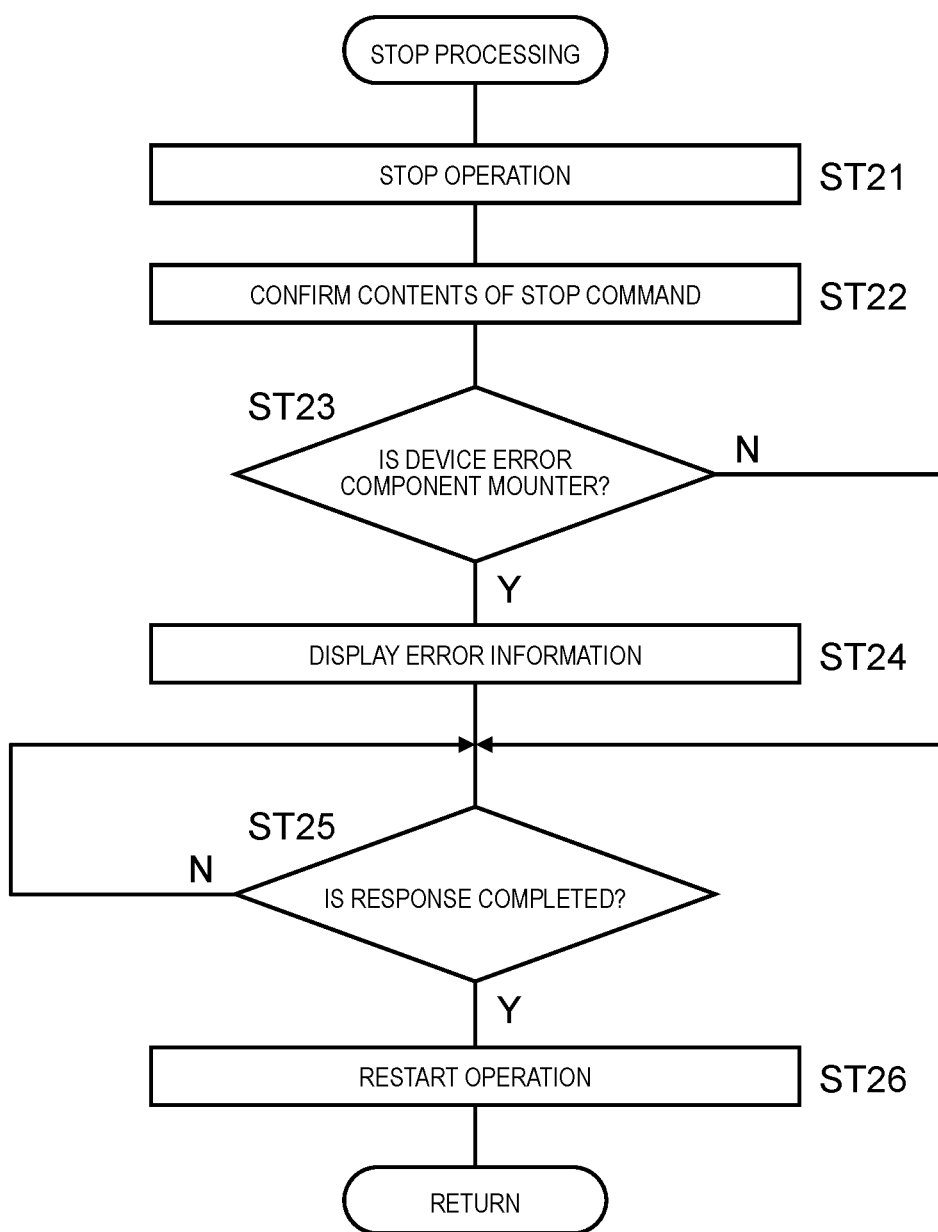
FIG. 16 is a flowchart of a subroutine illustrating the processing procedure of the component mounter according to the exemplary embodiment.

In the subroutine of the stop processing, component mounter 5 first stops the operation (step ST21 in the flowchart of FIG. 16). The content of the stop command is confirmed (step ST22), and it is determined whether or not the device itself corresponds to the error component mounter (step ST23). As a result, in a case where the device itself corresponds to the error component mounter, management device 3 displays the content on display device 25 based on the error information received from characteristic inspection device 8 (step ST24), and then, the process starts waiting for the response of the operator (step ST25). Meanwhile, in a case where the device itself does not correspond to the error component mounter in step ST23, the process starts waiting for the response of step ST25 directly from step ST23. In step ST25, in a case where it is detected that the operator has taken a response and a predetermined action, the operation is restarted (step ST26), and the subroutine is omitted.

In a case where component mounter 5 omits the subroutine in step ST11 or has not received the stop command from management device 3 in step ST10, it is determined whether or not the installation turn performed in immediately preceding step ST9 is the final installation turn (final turn) (step ST12). Determination on whether or not the installation turn is the final turn is determined by whether or not all the sequences of main data 41A of installation sequence program 41 are completed. As a result, in a case where the installation turn is not the final turn, the process returns to step ST4 in order to perform the next installation turn, and in a case where the installation turn is the final turn, the process proceeds to the next step ST13.

In step ST13, with reference to installation sequence program 41, component mounter 5 determines whether or not additional data 41B is added to installation sequence program 41 (whether or not there is added additional data 41B in step ST8). In a case where installation sequence program 41 has additional data 41B, inspection-required component CBH is installed in corresponding inspection area CR based on the added additional data 41B (step ST14, inspection-required component installing step). The inspection-required component installing step of step ST14 is a step of picking up component BH that requires inspection of electrical characteristics from component feeder 22 and installing component BH as inspection-required component CBH picked up from component feeder 22 in inspection area CR, in a case where it is detected that the target event has occurred in the target event occurrence detecting step of step ST4 and it is determined that inspection area CR is vacant in the determining step of step ST7.

When executing the inspection-required component installing step in step ST14, component mounter 5 writes and updates information (information indicating that the installation is completed) indicating that inspection-required component CBH is installed in inspection area CR in the inspection-required component installing step, into inspection area component information 45 (step ST15). Inspection area component information 45 is updated in this manner, and the data of installed inspection-required component CBH is removed (deleted) from the list of inspection-required component list data 44. When the process of step ST15 is performed, component mounter 5 conveys out board KB to the downstream side by board transporter 21 (step ST16).

Meanwhile, in step ST13, in a case where installation sequence program 41 does not have additional data 41B, component mounter 5 proceeds from step ST13 to step ST16 and conveys out board KB to the downstream side by board transporter 21. When board KB is conveyed out to the downstream side, component mounter 5 uploads inspection area component information 45 to management device 3 (step ST17). It is determined whether or not board KB conveyed out in step ST16 is final board KB (step ST18), the process returns to step ST2 in which installation of component BH to next board KB is performed in a case where board KB is not final board KB, and the component installation work is completed in a case where board KB is final board KB.

In this manner, the component mounting method by component mounter 5 in the exemplary embodiment includes an event occurrence detecting step of detecting that an event that requires inspection of electrical characteristics for component BH supplied by component feeder 22 has occurred, and a determining step of determining whether or not inspection area CR is vacant. Furthermore, the component mounting method includes an inspection-required component installing step of picking up component BH that requires inspection of electrical characteristics from component feeder 22 and installing component BH as inspection-required component CBH in inspection area CR, in a case where it is detected that an event has occurred in the event occurrence detecting step and it is determined that inspection area CR is vacant in the determining step.

Figure 17:
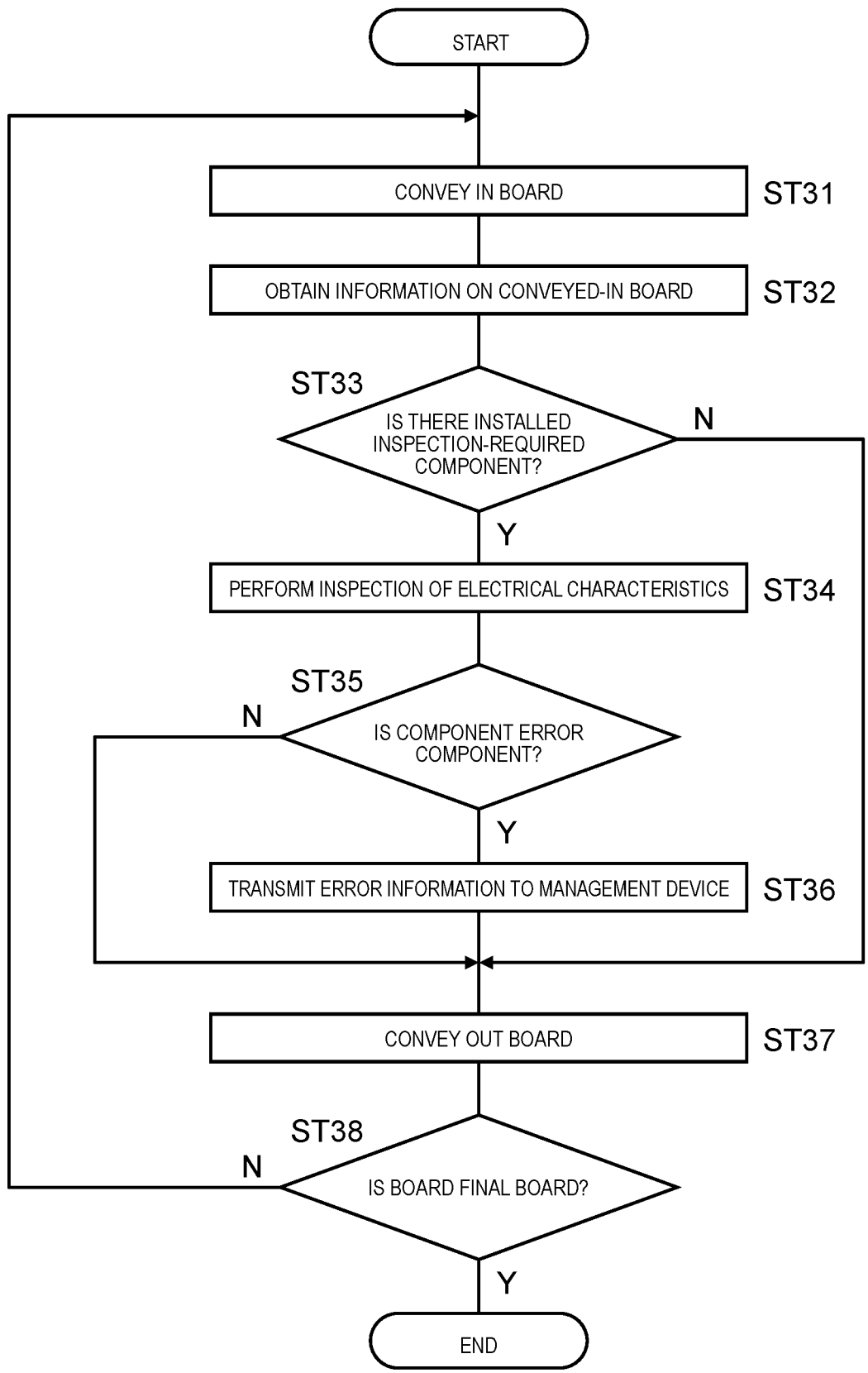
FIG. 17 is a flowchart illustrating a processing procedure of the characteristic inspection device according to the exemplary embodiment.

Next, the flow of the characteristic inspection work by the characteristic inspection device 8 will be described with reference to FIG. 17. When board KB is fed from the upstream side, characteristic inspection device 8 conveys in and positions board KB at a predetermined working position (step ST31). Based on board identification ID read when board KB is conveyed in, information on board KB is obtained (downloaded) from management device 3 (step ST32). Specifically, "information on board KB" is inspection area component information 45 for obtaining information regarding in which inspection area CR of conveyed-in board KB inspection-required component CBH is installed, and data related to the reference range for inspecting inspection-required component CBH.

In step ST32, when information on conveyed-in board KB is obtained from management device 3, characteristic inspection device 8 checks whether or not there is inspection-required component CBH installed in inspection area CR of board KB based on the obtained information (step ST33). As a result, in a case where there is installed inspection-required component CBH, characteristic inspection device 8 performs inspection of electrical characteristics for installed inspection-required component CBH (step ST34). It is determined whether or not the inspection-required component CBH which is a target of inspection is an error component(step ST35), and in a case where inspection-required component CBH is an error component, after transmitting the error information on the error component to management device 3 (step ST36), board KB is conveyed out (step ST37). Meanwhile, in a case where inspection-required component CBH is not an error component in step ST35, or in a case where there is no installed inspection-required component CBH in inspection area CR in step ST33, the process proceeds to step ST37, and board KB is conveyed out.

When board KB is conveyed out in step ST37, characteristic inspection device 8 determines whether or not conveyed-out board KB is final board KB (step ST38). In a case where board KB is not final board KB, the process returns to step ST31 in order to perform inspection for next board KB, and in a case where board KB is final board KB, the characteristic inspection work is completed.

Figure 18:
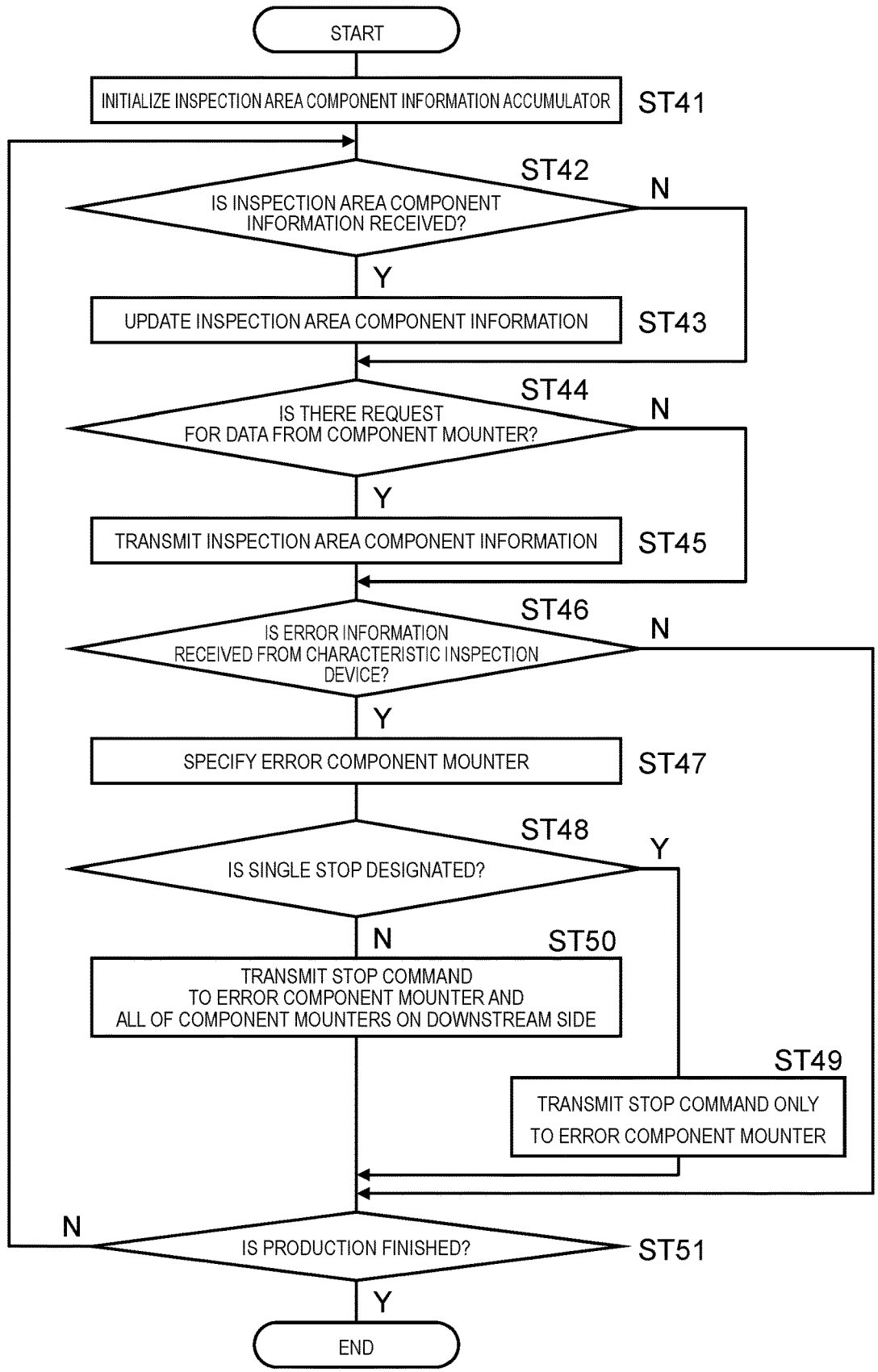
FIG. 18 is a flowchart illustrating a processing procedure of the management device according to the exemplary embodiment.

Next, the work flow by management device 3 will be described with reference to FIG. 18. When mounting work unit 2 starts the production of mounting board JKB, management device 3 first initializes inspection area component information accumulator 91b (step ST41). When initializing inspection area component information accumulator 91b, it is checked whether or not inspection area component information 45 is received from component mounter 5 (step ST42), and in a case where inspection area component information 45 is received (corresponding to the above-described step ST17), based on received inspection area component information 45, data is written and updated into inspection area component information accumulator 91b (step ST43). The data to be written into inspection area component information accumulator 91b may be only a change from the contents of original inspection area component information accumulator 91b. For example, in a case where information indicating that inspection-required component CBH is installed in inspection area CR that was vacant until then is fed by component mounter 5, only information indicating that inspection-required component CBH is installed in inspection area CR may be additionally written. In a case where there is no inspection area component information 45 which is an update target in inspection area component information accumulator 91b, inspection area component information 45 uploaded from component mounter 5 is registered to inspection area component information accumulator 91b.

When performing checking in step ST42, management device 3 checks whether or not the data (inspection area component information 45) is requested by component mounter 5 (step ST44). Board identification ID is included in this request. In a case where the data is requested by component mounter 5, inspection area component information 45 including corresponding board identification ID is transmitted to component mounter 5 that requests the data (step ST45). Accordingly, component mounter 5 that has requested management device 3 for data has obtained latest contents of inspection area component information 45 (corresponding to the above-described step ST3).

After checking in step ST44, management device 3 checks whether or not error information has been received from characteristic inspection device 8 (step ST46). In a case where the error information is received from characteristic inspection device 8, based on the received error information and inspection area component information 45 accumulated in inspection area component information accumulator 91b of management device storage unit 91, according to the above procedure, component mounter 5 in which inspection-required component CBH determined to be an error component is installed in inspection area CR is specified as "error component mounter" (step ST47).

When the error component mounter is specified in step ST47, management device 3 determines whether the designated stop option flag is "single stop" or "interlocking stop" (step ST48). In a case where "single stop" is designated, a stop command is transmitted only to component mounter 5 corresponding to the error component mounter (step ST49), and in a case where "interlocking stop" is designated, the stop command is transmitted to component mounter 5 corresponding to the error component mounter and all component mounters 5 positioned on the downstream side thereof (step ST50). Each component mounter 5 that has received the stop command transmitted from management device 3 in step ST49 or step ST50 stops the operation (corresponding to the above-described step ST21).

When the stop command is transmitted in step ST49 or step ST50, management device 3 checks whether or not mounting work unit 2 has finished the production (step ST51). In a case where no error information has been received from characteristic inspection device 8 in the above-described step ST46, the process proceeds from step ST46 to step ST51 to check whether or not mounting work unit 2 has finished the production. As a result, in a case where mounting work unit 2 has not finished the production, the process returns to step ST42 to continue the processing, and in a case where mounting work unit 2 has finished the production, the process is completed.

In this manner, component mounting system 1 in the present exemplary embodiment is configured to include: the plurality of component mounters 5 that install component BH supplied by component feeder 22 in product area PR by conveying in board KB having product area PR in which pattern electrode PD is disposed and inspection area CR in which inspection electrode CD is disposed from the device on the upstream side, and convey out board KB by installing inspection-required component CBH that requires inspection of electrical characteristics in the component supplied by component feeder 22 in inspection area CR; characteristic inspection device 8 that inspects the electrical characteristics of inspection-required component CBH installed in inspection area CR by these component mounters 5; and management device 3 that manages the plurality of component mounters 5 and characteristic inspection device 8. Each component mounter 5 transmits inspection area component information 45 in which the installed state of inspection-required component CBH in inspection area CR is recorded to management device 3, characteristic inspection device 8 determines whether or not inspection-required component CBH is an error component, and management device 3 specifies component mounter 5 in which inspection-required component CBH determined to be an error component is installed as an error component mounter based on the transmitted error information, and stops operation of the specified error component mounter. Therefore, it is possible to suppress the occurrence of loss as much as possible in a case where component feeder 22 of component mounter 5 supplies component BH that is not supposed to be originally supplied.

As described above, according to component mounting system 1 in the present exemplary embodiment, it is possible to suppress the occurrence of loss as much as possible in a case where component feeder 22 of component mounter 5 supplies component BH that is not supposed to be originally supplied.

The above-described exemplary embodiment is not limited to the description above, and various modifications and the like are possible. For example, in the above-described exemplary embodiment, receptor 52 of each component mounter 5 indirectly receives inspection area component information 45 from the device on the upstream side via management device 3, but may be configured to receive directly from the device on the upstream side without going through management device 3. Transmitter 53 of each component mounter 5 indirectly transmits updated inspection area component information 45 to the device on the downstream side via management device 3, but may be configured to transmit directly to the device on the downstream side without going through management device 3. In the above-described exemplary embodiment, the inspection-required component installing means for installing component BH picked up from component feeder 22 as inspection-required component CBH in inspection area CR is the same as installation head 23, but the inspection-required component installing means may be means different from installation head 23.

In the above-described exemplary embodiment, the number of inspection areas CR provided on board KB is three, but this is merely an example, and any number can be applied. In the above exemplary embodiment, component feeder 22 that supplies component BH is a tape feeder that supplies component BH by the feeding operation of the tape containing component BH, but component feeder 22 is not limited to a tape feeder, and other feeders (for example, a bulk feeder or a stick feeder) may be employed.

INDUSTRIAL APPLICABILITY

According to the component mounting system of the present disclosure, it is possible to suppress the occurrence of loss as much as possible in a case where the component feeder of the component mounter supplies a component that is not supposed to be originally supplied.

REFERENCE MARKS IN THE DRAWINGS 1 component mounting system
3 management device
5 component mounter
8 characteristic inspection device
22 component feeder
23 installation head (inspection-required component installing means)
31 mounter storage unit (storage means)
41 installation sequence program
41B additional data
45 inspection area component information
52 receptor (receiving means)
53 transmitter (inspection area component information transmitting means)
54 target event occurrence detector (target event occurrence detecting means)
56 vacancy determiner (determination means)

57 data adder (data adding means)
58 inspection area component information updater (inspection area component information updating means)
82b error determiner (error determination means)
82c error information transmitter (error information transmitting means)
92b error occurrence location identifier (error occurrence location identifying means)
92c stop command transmitter (stop means)
PR product area
PD pattern electrode
CR inspection area
CD inspection electrode
BH component
CBH inspection-required component
KB board

The invention claimed is:

1. A component mounting system comprising:
a conveyor that sequentially conveys a board between a plurality of component mounters, the board having a product area in which a pattern electrode incorporated in an electrical product is disposed and an inspection area in which an inspection electrode for inspection of electrical characteristics is disposed;
the plurality of component mounters, each of the component mounters installing a component supplied by a component feeder in the product area, and installing an inspection-required component that requires the inspection of the electrical characteristics in the inspection area;
a characteristic inspection device that inspects the electrical characteristics of the inspection-required component installed in the inspection area by any of the plurality of component mounters; and
a management device that manages the plurality of component mounters and the characteristic inspection device,
wherein each of the plurality of component mounters includes a transmitter that transmits inspection area component information to the management device, the inspection area component information including identification information of the component mounter, identification information of the board, and identification information of the inspection-required component installed in the inspection area,
wherein the characteristic inspection device includes:
an error determiner that identifies, as error components, any of the inspection-required components installed in the inspection area having an error, and
an error information transmitter that transmits error information to the management device, the error information being information about the error components, and
wherein the management device includes:
an error occurrence location identifier that identifies error component mounters based on the error information transmitted by the error information transmitter, the error component mounters being the component mounters that installed the error components, and
a stop command transmitter that stops an operation of the error component mounters identified by the error occurrence location identifier.

2. The component mounting system of claim 1, wherein the stop command transmitter stops the operation of all of the component mounters positioned on a downstream side of the error component mounter among the plurality of component mounters.

3. The component mounting system of claim 1, wherein the stop command transmitter stops the operation of the error component mounter by transmitting a stop command for stopping the operation of the error component mounter.

4. The component mounting system of claim 3, wherein the error component mounter to which the stop command is transmitted includes a display that displays information of the error component or information of the component feeder that has supplied the error component.

5. The component mounting system of claim 1, wherein the error information includes a board identification ID, a board area number, and an identification of whether or not the inspection-required component was correctly installed.

6. The component mounting system of claim 1, wherein the error determiner determines an error based on whether or not an obtained value of electrical characteristics is within a reference range as a result of inspecting the electrical characteristics of the inspection-required components.

* * * * *